(12) United States Patent
Degen et al.

(10) Patent No.: US 11,456,546 B2
(45) Date of Patent: Sep. 27, 2022

(54) PANE HAVING AN ELECTRICAL CONNECTION ELEMENT

(71) Applicant: SAINT-GOBAIN GLASS FRANCE, Courbevoie (FR)

(72) Inventors: Christoph Degen, Toenisvorst (DE); Bernhard Reul, Herzogenrath (DE); Mitja Rateiczak, Wuerselen (DE); Andreas Schlarb, Wuppertal (DE); Lothar Lesmeister, Landgraaf (NL)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 525 days.

(21) Appl. No.: 16/428,236

(22) Filed: May 31, 2019

(65) Prior Publication Data

US 2019/0288409 A1    Sep. 19, 2019

Related U.S. Application Data

(63) Continuation of application No. 14/115,844, filed as application No. PCT/EP2012/056963 on Apr. 17, 2012, now Pat. No. 10,355,378.

(30) Foreign Application Priority Data

May 10, 2011    (EP) ........................ 1165506

(51) Int. Cl.
*H01R 4/62*    (2006.01)
*H05B 3/84*    (2006.01)
*H01R 4/02*    (2006.01)

(52) U.S. Cl.
CPC ................. *H01R 4/62* (2013.01); *H05B 3/84* (2013.01); *H01R 4/02* (2013.01); *H05B 2203/016* (2013.01); *Y10T 29/49128* (2015.01)

(58) Field of Classification Search
CPC ........ H01R 4/62; H05B 3/84; Y10T 29/49128
(Continued)

(56) References Cited

U.S. PATENT DOCUMENTS 2,062,335 A    12/1936    Howard
2,481,385 A     9/1949    Bloom
(Continued)

FOREIGN PATENT DOCUMENTS

CN    200944682    9/2007
CN    101244686    8/2008
(Continued)

OTHER PUBLICATIONS

Machine Translation of WO2011107341; Dec. 2021 (Year: 2021).*
(Continued)

*Primary Examiner* — Tu B Hoang
*Assistant Examiner* — Thomas J Ward
(74) *Attorney, Agent, or Firm* — Pillsbury Winthrop Shaw Pittman LLP

(57) ABSTRACT

A pane, includes a substrate, an electrically conductive structure on a region of the substrate, a layer of a solder material on a region of the electrically conductive structure, and at least two soldering points of the at least one electrical connection element on the solder material, wherein the at least two soldering points form at least one contact surface between the at least one electrical connection element and the electrically conductive structure, and a shape of the at least one contact surface has at least one segment of an oval, an ellipse, or a circle with a central angle α of at least 90°.

15 Claims, 11 Drawing Sheets

Figure 1:
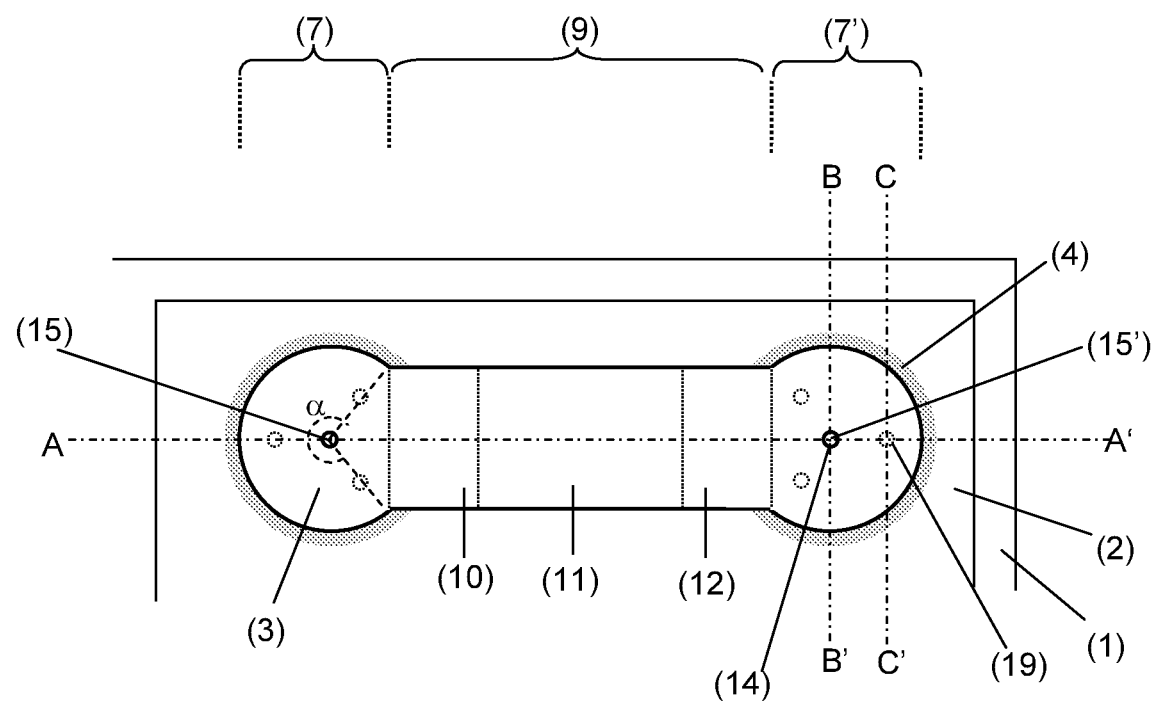

(58) Field of Classification Search
USPC .......................................................... 219/202
See application file for complete search history.

(56) References Cited

U.S. PATENT DOCUMENTS

| | | | |
|---|---|---|---|
| 2,644,066 A | 6/1953 | Glynn | |
| 2,672,414 A | 3/1954 | Phillips et al. | |
| 2,709,211 A | 5/1955 | Glynn | |
| 2,736,649 A | 2/1956 | Phillips | |
| 3,088,833 A | 5/1963 | Pirooz | |
| 3,204,326 A | 9/1965 | Granitsas | |
| 3,484,584 A | 12/1969 | Shaw | |
| 3,534,148 A | 10/1970 | Bange | |
| 3,746,536 A | 7/1973 | Kuse | |
| 3,880,369 A | 4/1975 | Kunstovny et al. | |
| 4,023,008 A | 5/1977 | Durussel | |
| 4,179,285 A | 12/1979 | Tanczyn | |
| 4,246,467 A | 1/1981 | Boaz | |
| 4,321,296 A | 3/1982 | Rougier | |
| 4,403,307 A | 9/1983 | Maeda | |
| 4,498,096 A | 2/1985 | Addie et al. | |
| 4,908,548 A | 3/1990 | Mizohata et al. | |
| 5,596,335 A | 1/1997 | Dishart et al. | |
| 5,738,554 A | 4/1998 | Borger et al. | |
| 5,961,737 A | 10/1999 | Glenn | |
| 6,284,985 B1 | 9/2001 | Naba et al. | |
| 6,396,026 B2 | 5/2002 | Gillner et al. | |
| 6,406,337 B1 | 6/2002 | Machado | |
| 6,638,120 B2 | 10/2003 | Costa | |
| 6,685,514 B2 | 2/2004 | Costa | |
| 6,787,700 B2 | 9/2004 | Nagao et al. | |
| 6,790,104 B2 | 9/2004 | Antaya et al. | |
| 6,816,385 B1 | 11/2004 | Alcoe | |
| 7,134,201 B2 | 11/2006 | Ackerman et al. | |
| 7,223,939 B2* | 5/2007 | Hoepfner | H05B 3/84 219/203 |
| 7,514,654 B2 | 4/2009 | Okajima et al. | |
| 7,675,004 B2 | 3/2010 | Nakajima | |
| 7,909,665 B2 | 3/2011 | Lyon | |
| 7,974,104 B2 | 7/2011 | Kitada et al. | |
| 8,816,214 B2 | 8/2014 | Ziegler et al. | |
| 8,816,215 B2 | 8/2014 | Reul et al. | |
| 8,905,778 B2 | 12/2014 | Jenrich et al. | |
| 9,385,437 B2 | 7/2016 | Cholewa et al. | |
| D815,042 S | 4/2018 | Jenrich | |
| 2002/0001997 A1 | 1/2002 | Reul | |
| 2002/0102886 A1 | 8/2002 | Costa | |
| 2002/0111081 A1 | 8/2002 | Machado | |
| 2003/0030064 A1 | 2/2003 | Takano et al. | |
| 2003/0073349 A1 | 4/2003 | Nagao et al. | |
| 2005/0029666 A1 | 2/2005 | Kurihara et al. | |
| 2006/0228953 A1 | 10/2006 | Pereira et al. | |
| 2006/0240265 A1 | 10/2006 | Cook | |
| 2007/0030064 A1 | 2/2007 | Yu | |
| 2007/0031279 A1 | 2/2007 | Soga | |
| 2007/0105412 A1 | 5/2007 | Hoepfner et al. | |
| 2007/0224842 A1* | 9/2007 | Hoepfner | B23K 35/264 439/34 |
| 2008/0164248 A1 | 7/2008 | Reul | |
| 2008/0230269 A1 | 9/2008 | Susai et al. | |
| 2008/0280503 A1* | 11/2008 | van der Meulen | H05B 3/84 439/736 |
| 2009/0044464 A1 | 2/2009 | Schmidt et al. | |
| 2009/0277671 A1 | 11/2009 | Hahn | |
| 2010/0285685 A1 | 11/2010 | Ziegler et al. | |
| 2010/0295187 A1 | 11/2010 | Tsuruoka et al. | |
| 2010/0321798 A1 | 12/2010 | Chen et al. | |
| 2011/0056589 A1 | 3/2011 | De Boer et al. | |
| 2011/0056747 A1 | 3/2011 | Matsushita et al. | |
| 2012/0060559 A1 | 3/2012 | Boussaad et al. | |
| 2012/0305311 A1 | 12/2012 | Jenrich | |
| 2012/0318566 A1 | 12/2012 | Reul et al. | |
| 2013/0043066 A1 | 2/2013 | Cholewa | |
| 2013/0045647 A1 | 2/2013 | Jenrich et al. | |
| 2014/0158424 A1 | 6/2014 | Schlarb et al. | |
| 2014/0170913 A1 | 6/2014 | Degen et al. | |
| 2014/0182932 A1 | 7/2014 | Cholewa et al. | |
| 2014/0301892 A1 | 10/2014 | Maekawa et al. | |
| 2015/0179539 A1 | 6/2015 | Tamai | |
| 2015/0236431 A1 | 8/2015 | Schmalbuch et al. | |
| 2016/0309588 A1 | 10/2016 | Cholewa et al. | |

FOREIGN PATENT DOCUMENTS

| | | | |
|---|---|---|---|
| DE | 1936780 | 2/1970 | |
| DE | 10046489 | 12/2001 | |
| DE | 20203202 | 6/2002 | |
| DE | 202008015441 | 10/2007 | |
| DE | 102006017675 | 4/2010 | |
| DE | 102009016353 | 10/2010 | |
| DE | 202011100906 | 6/2011 | |
| DE | 102010018860 | 11/2011 | |
| EA | 201290855 | 2/2013 | |
| EP | 0023121 | 1/1981 | |
| EP | 488878 | 6/1992 | |
| EP | 0720253 | 7/1996 | |
| EP | 0848449 | 6/1998 | |
| EP | 1488972 | 12/2004 | |
| EP | 1942703 | 7/2008 | |
| EP | 2299544 | 3/2011 | |
| EP | 2365730 | 9/2011 | |
| EP | 2367399 | 9/2011 | |
| EP | 2408260 | 1/2012 | |
| FR | 1104595 | 11/1955 | |
| GB | 751536 | 6/1956 | |
| GB | 1163224 | 9/1969 | |
| JP | S5678170 | 6/1981 | |
| JP | S60-208076 | 10/1985 | |
| JP | S60-212987 | 10/1985 | |
| JP | H0696847 | 4/1994 | |
| JP | H06-58557 | 8/1994 | |
| JP | H08246105 | 9/1996 | |
| JP | H09-139565 | 5/1997 | |
| JP | H09-226522 | 9/1997 | |
| JP | H10-163355 | 6/1998 | |
| JP | 2908922 | 6/1999 | |
| JP | H11-306862 | 11/1999 | |
| JP | H11-347785 | 12/1999 | |
| JP | 2001-126648 | 5/2001 | |
| JP | 2003-521093 | 7/2003 | |
| JP | 2004-512657 A | 4/2004 | |
| JP | 3957302 | 8/2007 | |
| JP | 2007335260 | 12/2007 | |
| JP | 2008218399 | 9/2008 | |
| JP | 2010-108854 | 5/2010 | |
| JP | 2010-527120 | 8/2010 | |
| JP | H05003722 | 8/2012 | |
| KR | 20080063712 | 7/2008 | |
| MX | 2013015237 | 2/2014 | |
| SE | WO2011/107341 | * 9/2011 | ............... H05B 3/84 |
| WO | WO 98/47200 | 10/1998 | |
| WO | WO 2004012302 | 2/2004 | |
| WO | WO 2004/068643 | 8/2004 | |
| WO | WO 2006098160 | 9/2006 | |
| WO | WO 2006/135469 | 12/2006 | |
| WO | WO 2006132319 | 12/2006 | |
| WO | WO 2007/110610 | 10/2007 | |
| WO | WO 2009135469 | 11/2009 | |
| WO | WO 2012152543 | 11/2012 | |
| WO | WO 2013004434 | 1/2013 | |

OTHER PUBLICATIONS

Non-Final Office Action for U.S. Appl. No. 14/115,091, filed Feb. 10, 2014 on behalf of Saint-Gobain Glass France, dated Apr. 6, 2018. 16 pages.

Restriction Requirement for U.S. Appl. No. 14/115,839, filed Feb. 21, 2014 on behalf of Saint-Gobain Glass France, dated Jan. 11, 2016. 9 pages.

Non-Final Office Action for U.S. Appl. No. 14/115,839, filed Feb. 21, 2014 on behalf of Saint-Gobain Glass France, dated May 4, 2016. 17 pages.

(56) References Cited

OTHER PUBLICATIONS

Restriction Requirement for U.S. Appl. No. 14/115,091, filed Feb. 10, 2014 on behalf of Saint-Gobain Glass France, dated Sep. 9, 2015. 10 pages.
Non-Final Office Action for U.S. Appl. No. 14/115,091, filed Feb. 10, 2014 on behalf of Saint-Gobain Glass France, dated Jan. 20, 2016. 22 pages.
Final Office Action for U.S. Appl. No. 14/115,091, filed Feb. 10, 2014 on behalf of Saint-Gobain Glass France, dated Jun. 14, 2016. 15 pages.
Final Office Action issued for U.S. Appl. No. 14/115,839, filed Feb. 21, 2014 on behalf of Saint-Gobain Glass France, dated Feb. 20, 2018. 17 pages.
Non-Final Office Action for U.S. Appl. No. 14/115,091, filed Feb. 10, 2014 on behalf of Harald Cholewa, dated May 24, 2017. 15 pages.
Final Office Action for U.S. Appl. No. 14/115,901, filed Feb. 10, 2014 on behalf of Harald Cholewa, dated Nov. 14, 2017. 21 paQes.
Non-Final Office Action for U.S. Appl. No. 14/115,839, filed Feb. 21, 2014 on behalf of Christoph Degen, dated Sep. 20, 2017. 15 pages.
PCT International Preliminary Report on Patentability dated Nov. 12, 2013 for PCT/EP2012/056965 filed on Apr. 17, 2012 in the name of Saint-Gobain Glass France (English Translation+German Original).
PCT International Preliminary Report on Patentability dated Nov. 12, 2013 for PCT/EP2012/056964 filed on Apr. 17, 2012 in the name of Saint-Gobain Glass France (English Translation+German Original).
PCT International Preliminary Report on Patentability dated Nov. 12, 2013 for PCT/EP2012/056963 filed on Apr. 17, 2012 in the name of Saint-Gobain Glass France (English Translation+German Original).
PCT Written Opinion dated Jun. 1, 2012 for PCT/EP2012/056963 filed on Apr. 17, 2012 in the name Saint-Gobain Glass France (English translation and German original).
PCT International Search Report dated Jun. 14, 2012 for PCT/EP2012/056964 filed on Apr. 17, 2012 in the name of Saint-Gobain Glass France (English translation and German original).
PCT International Search Report dated Jun. 8, 2012 for PCT/EP2012/056965 filed on Apr. 17, 2012 in the name of Saint-Gobain Glass France (English translation and German original).
PCT International Search Report dated Jun. 1, 2012 for PCT/EP2012/056963 filed on Apr. 17, 2012 in the name of Saint-Gobain Glass France (English translation and German original).
Advisory Action for U.S. Appl. No. 13/695,426, filed Oct. 30, 2012 on behalf of Saint-Gobain Glass France, dated Sep. 30, 2015. 4 pages.
Corrected Notice of Allowability for U.S. Appl. No. 14/115,839, filed on Feb. 21, 2014, on behalf of Saint-Gobain Glass France, dated Oct. 4, 2018. 9 pages.
Final Office Action for U.S. Appl. No. 13/695,426, filed Oct. 30, 2012 on behalf of Saint-Gobain Glass France, dated Jul. 15, 2015. 19 pages.
Final Office Action for U.S. Appl. No. 14/115,091, filed Feb. 10, 2014, on behalf of Saint-Gobain Glass France, dated Sep. 18, 2018. 15 pages.
Final Office Action for U.S. Appl. No. 15/197,298, filed Jun. 29, 2016 on behalf of Saint-Gobain Glass France, dated Feb. 21, 2019. 31 pages.
International Preliminary Report on Patentability for International Application No. PCT/EP2011/052195 filed Feb. 15, 2011 on behalf of Saint-Gobain Glass France, dated Sep. 25, 2012. 21 pages. (German Original +English Translation).
International Preliminary Report on Patentability for International Application No. PCT/EP2011/052196 filed Feb. 15, 2011 on behalf of Saint-Gobain Glass France, dated Sep. 25, 2012. 22 pages. (German Original +English Translation).
International Preliminary Report on Patentability for International Application No. PCT/EP2011/061195 filed Jul. 4, 2011 on behalf of Saint-Gobain Glass France, dated Jan. 15, 2013. 21 pages. (German Original+English Translation).
International Search Report for International Application No. PCT/EP2011/052195 filed Feb. 15, 2011 on behalf of Saint-Gobain Glass France, dated May 12, 2011. 6 pages. (English Translation+German Original).
International Search Report for International Application No. PCT/EP2011/052196 filed Feb. 15, 2011 on behalf of Saint-Gobain Glass France, dated May 17, 2011. 7 pages. (English Translation+German Original).
International Search Report for International Application No. PCT/EP2011/061195 filed Jul. 4, 2011 on behalf of Saint-Gobain Glass France, dated Sep. 26, 2011. 6 pages. (English Translation+German Original).
Non-Final Office Action for U.S. Appl. No. 13/575,566, filed Jul. 26, 2012 on behalf of Saint-Gobain Glass France, dated Mar. 7, 2014. 14 pages.
Non-Final Office Action for U.S. Appl. No. 13/580,741, filed Aug. 23, 2012 on behalf of Saint-Gobain Glass France, dated Mar. 14, 2014. 13 pages.
Non-Final Office Action for U.S. Appl. No. 13/695,426, filed Oct. 30, 2012 on behalf of Saint-Gobain Glass France, dated Jan. 28, 2015. 38 pages.
Non-Final Office Action for U.S. Appl. No. 13/695,426, filed Oct. 30, 2012 on behalf of Saint-Gobain Glass France, dated Nov. 24, 2015. 10 pages.
Non-Final Office Action for U.S. Appl. No. 15/197,298, filed Jun. 29, 2016 on behalf of Saint-Gobain Glass France, dated Jul. 31, 2018. 27 pages.
Notice of Allowance for U.S. Appl. No. 13/575,566, filed Jul. 26, 2012 on behalf of Saint-Gobain Glass France, dated Jul. 7, 2014. 9 pages.
Notice of Allowance for U.S. Appl. No. 13/580,741, filed Aug. 23, 2012 on behalf of Saint-Gobain Glass France, dated Jul. 8, 2014. 10 pages.
Notice of Allowance for U.S. Appl. No. 13/695,426, filed Oct. 30, 2012 on behalf of Saint-Gobain Glass France, dated Apr. 26, 2016. 11 pages.
Notice of Allowance for U.S. Appl. No. 14/115,839, filed Feb. 21, 2014, on behalf of Saint-Gobain Glass France, dated Sep. 12, 2018. 13 pages.
Notice of Opposition for European Application No. 12714016.8 filed Dec. 20, 2017 on behalf of Saint-Gobain Glass France, dated Sep. 28, 2018. 18 pages.
Restriction Requirement for U.S. Appl. No. 13/695,426, filed Oct. 30, 2012 on behalf of Saint-Gobain Glass France, dated Oct. 20, 2014. 9 pages.
Restriction Requirement for U.S. Appl. No. 15/197,298, filed Jun. 29, 2016 on behalf of Saint-Gobain Glass France, dated Mar. 22, 2018. 7 pages.
Written Opinion for International Application No. PCT/EP2011/052195 filed Feb. 15, 2011 on behalf of Saint-Gobain Glass France, dated May 12, 2011. 19 pages. (English Translation +German Original).
Written Opinion for International Application No. PCT/EP2011/052196 filed Feb. 15, 2011 on behalf of Saint-Gobain Glass France, dated May 17, 2011. 21 pages. (English Translation +German Original).
Written Opinion for International Application No. PCT/EP2011/061195 filed Jul. 4, 2011 on behalf of Saint-Gobain Glass France, dated Sep. 26, 2011. 19 pages. (English Translation +German Original).
PCT Written Opinion for PCT/EP2013/064576 filed Jul. 10, 2013 on behalf of Saint-Gobain Glass France, dated Oct. 22, 2013. 16 pages German original+English translation.
PCT Written Opinion for PCT/EP2013/064575 filed Jul. 10, 2013 on behalf of Saint-Gobain Glass France, dated Oct. 17, 2013. 16 pages German original+English translation.
PCT International Search Report for PCT/EP2013/064576 filed Jul. 10, 2013 on behalf of Saint-Gobain Glass France, dated Oct. 22, 2013. 2 pages.

(56) References Cited

OTHER PUBLICATIONS

PCT International Search Report for PCT/EP2013/064575 filed Jul. 10, 2013 on behalf of Saint-Gobain Glass France, dated Oct. 17, 2013. 7 pages German original+English translation Final Office Action for U.S. Appl. No. 14/115,839, filed Feb. 21, 2014 on behalf of Christoph Degen, dated Oct. 19, 2016. 15 pages.

Non-Final Office Action for U.S. Appl. No. 14/424,936, filed Feb. 27, 2015 on behalf of Klaus Schmalbuch, dated Sep. 8, 2016. 7 pages Non-Final Office Action for U.S. Appl. No. 14/424,939, filed Feb. 27, 2015 on behalf of Klaus Schmalbuch, dated Feb. 4, 2016. 17 pages.

Non-Final Office Action for U.S. Appl. No. 14/424,939, filed Feb. 27, 2015 on behalf of Klaus Schmalbuch, dated Jul. 6, 2016. 16 pages.

PCT Written Opinion for PCT/EP2012/056965 filed Apr. 17, 2012 on behalf of Saint-Gobain Glass France, dated Jun. 8, 2012. 12 pages German original+English translation.

PCT Written Opinion for PCT/EP2012/056964 filed Apr. 17, 2012 on behalf of Saint-Gobain Glass France, dated Jun. 14, 2012. 16 pages German original+English translation.

\* cited by examiner

A - A'

B - B'

C - C'

D – D'

PANE HAVING AN ELECTRICAL CONNECTION ELEMENT

The present application is a continuation of U.S. application Ser. No. 14/115,844, filed Apr. 18, 2013, which in turn is the US national stage of International Patent Application PCT/EP2012/056963 filed on Apr. 17, 2012 which, in turn, claims priority to European Patent Application EP 11165506. 4 filed on May 10, 2011, the entire contents of which are incorporated herein by reference in their entireties.

The invention relates to a pane with an electrical connection element and an economical and environmentally friendly method for its manufacture.

The invention further relates to a pane with an electrical connection element for vehicles with electrically conductive structures such as, for instance, heating conductors or antenna conductors. The electrically conductive structures are customarily connected to the onboard electrical system via soldered-on electrical connection elements. Due to different coefficients of thermal expansion of the materials used, mechanical stresses occur that strain the panes and can cause breakage of the pane during manufacture and operation.

Lead-containing solders have high ductility that can compensate the mechanical stresses occurring between an electrical connection element and the pane by plastic deformation. However, because of the End of Life Vehicles Directive 2000/53/EC, lead-containing solders have to be replaced by lead-free solders within the EC. The directive is referred to, in summary, by the acronym ELV (End of Life Vehicles). The objective is to ban extremely problematic components from products resulting from the massive increase in disposable electronics. The substances affected are lead, mercury, and cadmium. This relates, among other things, to the implementation of lead-free soldering materials in electrical applications on glass and the introduction of corresponding replacement products.

EP 1 942 703 A2 discloses an electrical connection element on panes of vehicles, wherein the difference in the coefficient of thermal expansion of the pane and the electrical connection element is $<5\times10^{-6}/°$ C. and the connection element contains predominantly titanium and the contact surface between the connection element and the electrically conductive structure is rectangular. In order to enable adequate mechanical stability and processability, it is proposed to use an excess of solder material. The excess of solder material flows out from the intermediate space between the connection element and the electrically conductive structure. The excess of solder material causes high mechanical stresses in the glass pane. These mechanical stresses ultimately result in breakage of the pane.

The object of the present invention is to provide a pane with an electrical connection element and an economical and environmentally friendly method for its manufacture, whereby critical mechanical stresses in the pane are avoided.

The object of the present invention is accomplished according to the invention by a device according to independent claim 1. Preferred embodiments emerge from the subclaims.

The pane according to the invention with at least one connection element comprises the following characteristics:
- a substrate,
- an electrically conductive structure on a region of the substrate,
- a layer of a solder material on a region of the electrically conductive structure, and
- at least two soldering points of the connection element on the solder material, wherein
- the soldering points form at least one contact surface between the connection element and the electrically conductive structure, and
- the shape of the contact surface has at least one segment of an oval, of an ellipse, or of a circle with a central angle of at least 90°.

The central angle of the segment is from 90° to 360°, preferably from 140° to 360°, for example, from 180° to 330° or from 200° to 330°. Preferably, the shape of the contact surface between the connection element and the electrically conductive structure has at least two semi-ellipses, particularly preferably two semicircles. Very particularly preferably, the contact surface is shaped as a rectangle with two semicircles arranged on opposite sides. In an alternative particularly preferred embodiment of the invention, the shape of the contact surface has two circular segments with central angles from 210° to 360° auf. The shape of the contact surface can also, for example, comprise two segments of an oval, of an ellipse, or of a circle, with the central angle being from 180° to 350°, preferably from 210° to 310°.

In an advantageous embodiment of the invention, the soldering points form two contact surfaces between the connection element and the electrically conductive structure separated from each other. Each contact surface is arranged on the surface of one of two foot regions of the connection element facing the substrate. The foot regions are connected to each other via a bridge. The two contact surfaces are connected to each other via the surface of the bridge facing the substrate. The shape of each of the two contact surfaces has at least one segment of an oval, of an ellipse, or of a circle with a central angle from 90° to 360°, preferably from 140° to 360°. Each contact surface can have an oval, preferably an elliptical structure. Particularly preferably, each contact surface is shaped as a circle. Alternatively, each contact surface is preferably shaped as a circular segment with a central angle of at least 180°, particularly preferably at least 200°, very particularly preferably at least 220°, and in particular at least 230°. The circular segment can have, for example, a central angle from 180° to 350°, preferably from 200° to 330°, particularly preferably from 210° to 310°. In another advantageous embodiment of the connection element according to the invention, each contact surface is designed as a rectangle with two semi-ovals, preferably semi-ellipses, particularly preferably semicircles arranged on opposite sides.

An electrically conductive structure is applied on the pane. The electrical connection element is electrically connected to the electrically conductive structure on subregions by a soldering material.

The connection element is connected, by soldering, for example, resistance soldering, to the electrically conductive structure via the contact surface or the contact surfaces. In the resistance soldering, two soldering electrodes are used, with each soldering electrode being brought into contact with a soldering point of the connection element. During the soldering process, a current flows from one soldering electrode to the second soldering electrode via the connection element. The contact between the soldering electrode and the connection element preferably occurs over the smallest possible surface area. For example, the soldering electrodes have a pointed design. The small contact surface effects a high current density in the region of the contact between the soldering electrode and the connection element. The high current density results in a heating of the contact region between the soldering electrode and connection element. Heat distribution spreads starting from each of the two contact regions between the soldering electrode and the connection element. The isotherms can, for the case of two spot heat sources, be depicted, for the sake of simplicity, as concentric circles around the soldering points. The precise shape of the distribution depends on the shape of the connection element. The heating in the region of the contact surfaces between the connection element and the electrically conductive structure results in the melting of the solder material.

According to the prior art, the connection element is preferably connected to the electrically conductive structure, for example, via a rectangular contact surface. Due to the heat distribution spreading from the soldering points, temperature differences arise along the edges of a rectangular contact surface during the soldering process. As a result, regions of the contact surface in which the soldering material is not completely melted can exist. These regions lead to poor adhesion of the connection element and to mechanical stresses in the pane.

The advantage of the invention resides in the forming of the contact surface or the contact surfaces between the connection element and the electrically conductive structure. The shape of the contact surfaces is, at least in a substantial part of the edges, rounded and has, preferably, circles or circular segments. The shape of the contact surfaces approximates the shape of the heat distribution around the soldering points during the soldering process. Consequently, only slight or no temperature differences arise along the edges of the contact surfaces during the soldering process. This results in uniform melting of the solder material in the entire region of the contact surfaces between the connection element and the electrically conductive structure. This is particularly advantageous with regard to the adhesion of the connection element, the shortening of the duration of the soldering process, and the avoidance of mechanical stresses in the pane. In particular, with the use of a leadfree solder material that can compensate mechanical stresses less well due to its lower ductility compared to lead-containing solder materials, there is a particular advantage.

The connection elements are, in the plan view, for example, preferably 1 mm to 50 mm long and wide and, particularly preferably 2 mm to 30 mm long and wide and, very particularly preferably 2 mm to 8 mm wide and 10 mm to 24 mm long.

Two contact surfaces connected to each other by a bridge are, for example, preferably 1 mm to 15 mm long and wide and particularly preferably 2 mm to 8 mm long and wide.

The solder material flows out with an outflow width of <1 mm from the intermediate space between the connection element and the electrically conductive structure. In a preferred embodiment, the maximum outflow width is preferably less than 0.5 mm and, in particular, roughly 0 mm. This is particularly advantageous with regard to the reduction of mechanical stresses in the pane, the adhesion of the connection element, and the reduction in the amount of solder.

The maximum outflow width is defined as the distance between the outer edges of the connection element and the point of the solder material crossover, at which the solder material drops below a layer thickness of 50 μm. The maximum outflow width is measured on the solidified solder material after the soldering process.

A desired maximum outflow width is obtained through a suitable selection of solder material volume and vertical distance between the connection element and the electrically conductive structure, which can be determined by simple experiments. The vertical distance between the connection element and the electrically conductive structure can be predefined by an appropriate process tool, for example, a tool with an integrated spacer.

The maximum outflow width can even be negative, i.e., pulled back into the intermediate space formed by an electrical connection element and an electrically conductive structure.

In an advantageous embodiment of the pane according to the invention, the maximum outflow width is pulled back in a concave meniscus in the intermediate space formed by the electrical connection element and the electrically conductive structure. A concave meniscus is created, for example, by increasing the vertical distance between the spacer and the conductive structure during the soldering process, while the solder is still fluid.

The bridge between two foot regions of the connection element according to the invention is preferably shaped flat in sections. Particularly preferably, the bridge consists of three flat segments. "Flat" means that the bottom of the connection element forms one plane. The angle between the surface of the substrate and the bottom of each flat segment of the bridge directly adjacent to a foot region is preferably <90°, particularly preferably between 1° and 85°, very particularly preferably between 2° and 75°, and in particular between 3° and 60°. The bridge is shaped such that each flat segment adjacent a foot region is inclined in the direction turned away from the immediately adjacent foot region.

The advantage resides in the action of the capillary effect between the electrically conductive structure and the segments of the bridge adjacent the contact surfaces. The capillary effect is a consequence of the small distance between the electrically conductive structure and the segments of the bridge adjacent the contact surfaces. The small distance results from the angle <90° between the surface of the substrate and the bottom of each flat section of the bridge directly adjacent a foot region. The desired distance between the connection element and the electrically conductive structure is set according to the melting of the solder material. Excess solder material is controlledly sucked by means of the capillary effect into the volume delimited by the bridge and the electrically conductive structure. Thus, the solder material crossover on the outer edges of the connection element is reduced and, with it, the maximum outflow width. A reduction of the mechanical stresses in the pane is thus achieved.

In the context of the definition of the maximum outflow width, the edges of the contact surfaces to which the bridge is connected are not outer edges of the connection element.

The cavity that is delimited by the electrically conductive structure and the bridge can be completely filled with solder material. Preferably, the cavity is not completely filled with solder material.

In another advantageous embodiment of the invention, the bridge is curved. The bridge can have a single direction of curvature. The bridge, preferably, has the profile of an oval arc, particularly preferably the profile of an elliptical arc, and very particularly preferably, the profile of a circular arc. The radius of curvature of the circular arc is, for example, preferably from 5 mm to 15 mm, with a connection element length of 24 mm. The direction of curvature of the bridge can also change.

The bridge can also consist of at least two subelements that are in direct contact with each other. The projection of the bridge into the plane of the substrate surface can also be curved. Preferably, in that case, the direction of curvature changes in the center of the bridge. The bridge does not have to have a constant width.

In an advantageous embodiment of the invention, each of the two soldering points is arranged on a contact bump. The contact bumps are arranged on the surface of the connection element facing away from the substrate. The contact bumps preferably contain the same alloy as the connection element. Each contact bump is preferably curved convexly at least in the region facing away from the surface of the substrate. Each contact bump is shaped, for example, as a segment of a rotational ellipsoid or as a spherical segment. Alternatively, the contact bump can be shaped as a rectangular solid, with the surface turned away from the substrate curved convexly. The contact bumps preferably have a height of 0.1 mm to 2 mm, particularly preferably of 0.2 mm to 1 mm. The length and width of the contact bumps is preferably between 0.1 and 5 mm, very particularly preferably between 0.4 mm and 3 mm. The contact bumps can be designed as embossings. The contact bumps can, in an advantageous embodiment, be formed in one piece with the connection element. The contact bumps can, for example, be formed by reshaping a connection element with a flat surface in the initial state on the surface, for example, by stamping or deep drawing. In the process, a corresponding depression can be created on the surface of the connection element opposite the contact bump.

For the soldering, electrodes whose contact side is flat can be used. The electrode surface is brought into contact with the contact bump. For this, the electrode surface is arranged parallel to the surface of the substrate. The point on the convex surface of the contact bump that has the greatest vertical distance from the surface of the substrate is arranged between the electrode surface and the surface of the substrate. The contact region between the electrode surface and the contact bump forms the soldering point. The position of the soldering point is preferably determined by the point on the contract surface of the contact bump that has the greatest vertical distance from the surface of the substrate. The position of the soldering point is independent of the position of the solder electrode on the connection element. That is particularly advantageous with regard to a reproducible, uniform heat distribution during the soldering process. The heat distribution during the soldering process is determined by the position, the size, the arrangement, and the geometry of the contact bump.

In an advantageous embodiment of the invention, at least two spacers are arranged on each of the contact surfaces of the connection element. The spacers contain, preferably, the same alloy as the connection element. Each spacer is shaped, for example, as a cube, as a pyramid, as a segment of a rotational ellipsoid, or as a segment of a sphere. The spacers have, preferably, a width of $0.5 \times 10^{-4}$ m to $10 \times 10^{-4}$ m and a height of $0.5 \times 10^{-4}$ m to $5 \times 10^{-4}$ m, particularly preferably, of $1 \times 10^{-4}$ m to $3 \times 10^{-4}$ m. By means of the spacers, the formation of a uniform layer of solder material is favored. That is particularly advantageous with regard to the adhesion of the connection element. The spacers can be formed in one piece with the connection element. The spacers can, for example, be formed on the contact surface by reshaping a connection element with flat contact surfaces in the initial state, for example, by stamping or deep drawing. In the process, a corresponding depression can be created on the surface of the connection element opposite the contact surface.

By means of the contact bumps and the spacers, a homogeneous, uniformly thick, and uniformly fuzed layer of the solder material is obtained. Thus, mechanical stresses between the connection element and the pane can be reduced. This is particularly advantageous with the use of a leadfree solder material that can compensate mechanical stresses less well due to its lower ductility compared to lead-containing solder materials.

The substrate contains, preferably, glass, particularly preferably, flat glass, float glass, quartz glass, borosilicate glass, soda lime glass. In an alternative preferred embodiment, the substrate contains polymers, particularly preferably, polyethylene, polypropylene, polycarbonate, polymethyl methacrylate, and/or mixtures thereof.

The substrate has a first coefficient of thermal expansion. The connection element has a second coefficient of thermal expansion.

The first coefficient of thermal expansion is preferably from $8 \times 10^{-6}/°$ C. to $9 \times 10^{-6}/°$ C. The substrate contains, preferably, glass that has, preferably, a coefficient of thermal expansion from $8.3 \times 10^{-6}/°$ C. to $9 \times 10^{-6}/°$ C. in a temperature range from 0° C. to 300° C.

The connection element according to the invention preferably contains at least an iron-nickel alloy, an iron-nickel-cobalt alloy, or an iron-chromium alloy.

The connection element according to the invention contains preferably 50 wt.-% to 89.5 wt.-% iron, 0 wt.-% to 50 wt.-% nickel, 0 wt.-% to 20 wt.-% chromium, 0 wt.-% to 20 wt.-% cobalt, 0 wt.-% to 1.5 wt.-% magnesium, 0 wt.-% to 1 wt.-% silicon, 0 wt.-% to 1 wt.-% carbon, 0 wt.-% to 2 wt.-% manganese, 0 wt.-% to 5 wt.-% molybdenum, 0 wt.-% to 1 wt.-% titanium, 0 wt.-% to 1 wt.-% niobium, 0 wt.-% to 1 wt.-% vanadium, 0 wt.-% to 1 wt.-% aluminum, and/or 0 wt.-% to 1 wt.-% tungsten.

In an advantageous embodiment of the invention, the difference between the first and the second coefficient of expansion is $\geq 5 \times 10^{-6}/°$ C. The second coefficient of thermal expansion is, in that case, preferably from $0.1 \times 10^{-6}/°$ C. to $4 \times 10^{-6}/°$ C., particularly preferably from $0.3 \times 10^{-6}/°$ C. to $3 \times 10^{-6}/°$ C. in a temperature range from 0° C. to 300° C.

The connection element according to the invention contains preferably at least 50 wt.-% to 75 wt.-% iron, 25 wt.-% to 50 wt.-% nickel, 0 wt.-% to 20 wt.-% cobalt, 0 wt.-% to 1.5 wt.-% magnesium, 0 wt.-% to 1 wt.-% silicon, 0 wt.-% to 1 wt.-% carbon and/or 0 wt.-% to 1 wt.-% manganese.

The connection element according to the invention contains preferably chromium, niobium, aluminum, vanadium, tungsten, and titanium at a proportion of 0 wt.-% to 1 wt.-%, molybdenum at a proportion of 0 wt.-% to 5 wt.-%, as well as production-related admixtures.

The connection element according to the invention contains preferably at least 55 wt.-% to 70 wt.-% iron, 30 wt.-% to 45 wt.-% nickel, 0 wt.-% to 5 wt.-% cobalt, 0 wt.-% to 1 wt.-% magnesium, 0 wt.-% to 1 wt.-% silicon, and/or 0 wt.-% to 1 wt.-% carbon.

The connection element according to the invention contains preferably invar (FeNi).

Invar is an iron-nickel alloy with a content of, for example, 36 wt.-% nickel (FeNi36). There is a group of alloys and compounds that have the property of having abnormally small or sometimes negative coefficients of thermal expansion in certain temperature ranges. Fe65Ni35 invar contains 65 wt.-% iron and 35 wt.-% nickel. Up to 1 wt.-% magnesium, silicon, and carbon are usually alloyed to change the mechanical properties. By alloying 5 wt.-% cobalt, the coefficient of thermal expansion can be further reduced. One name for the alloy is Inovco, FeNi33Co4.5 with an coefficient of expansion (20° C. to 100° C.) of $0.55 \times 10^{-6}/°$ C.

If an alloy such as invar with a very low absolute coefficient of thermal expansion of $<4 \times 10^{6}/°$ C. is used, overcompensation of mechanical stresses occurs by noncritical pressure stresses in the glass or by noncritical tensile stresses in the alloy.

In another advantageous embodiment of the invention, the difference between the first and the second coefficient of expansion is $<5 \times 10^{-6}/°$ C. Because of the small difference between the first and the second coefficient of thermal expansion, critical mechanical stresses in the pane are avoided and better adhesion is obtained. The second coefficient of thermal expansion is, in that case, preferably $4 \times 10^{-6}/°$ C. to $8 \times 10^{-6}/°$ C., particularly preferably $4 \times 10^{-6}/°$ C. to $6 \times 10^{-6}/°$ C. in a temperature range from 0° C. to 300° C.

The connection element according to the invention contains preferably at least 50 wt.-% to 60 wt.-% iron, 25 wt.-% to 35 wt.-% nickel, 15 wt.-% to 20 wt.-% cobalt, 0 wt.-% to 0.5 wt.-% silicon, 0 wt.-% to 0.1 wt.-% carbon, and/or 0 wt.-% to 0.5 wt.-% manganese.

The connection element according to the invention contains preferably kovar (FeCoNi).

Kovar is an iron-nickel-cobalt alloy that has coefficients of thermal expansion of usually roughly $5 \times 10^{-6}/°$ C. The coefficient of thermal expansion is thus less than the coefficient of typical metals. The composition contains, for example, 54 wt.-% iron, 29 wt.-% nickel, and 17 wt.-% cobalt. In the area of microelectronics and microsystem technology, kovar is, consequently, used as a housing material or as a submount. Submounts lie, according to the sandwich principle, between the actual substrate material and the material with, for the most part, a clearly higher coefficient of expansion. Kovar thus serves as a compensating element which absorbs and reduces the thermo-mechanical stresses caused by the different coefficients of thermal expansion of the other materials. Similarly, kovar is used for metal-glass implementations of electronic components, material transitions in vacuum chambers.

The connection element according to the invention contains preferably iron-nickel alloys and/or iron-nickel-cobalt-alloys post-treated thermally by annealing.

In another advantageous embodiment of the invention, the difference between the first and the second coefficient of expansion is likewise $<5 \times 10^{-6}/°$ C. The second coefficient of thermal expansion is preferably from $9 \times 10^{-6}/°$ C. to $13 \times 10^{-6}/°$ C., particularly preferably from $10 \times 10^{-6}/°$ C. to $11.5 \times 10^{-6}/°$ C. in a temperature range from 0° C. to 300° C.

The connection element according to the invention contains preferably at least 50 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, and/or 0 wt.-% to 1 wt.-% titanium. In addition, the connection element can contain admixtures of other elements, including vanadium, aluminum, niobium, and nitrogen.

The connection element according to the invention can also contain at least 66.5 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, 0 wt.-% to 2 wt.-% niobium, and/or 0 wt.-% to 1 wt.-% titanium.

The connection element according to the invention contains preferably at least 65 wt.-% to 89.5 wt.-% iron, 10.5 wt.-% to 20 wt.-% chromium, 0 wt.-% to 0.5 wt.-% carbon, 0 wt.-% to 2.5 wt.-% nickel, 0 wt.-% to 1 wt.-% manganese, 0 wt.-% to 1 wt.-% molybdenum, and/or 0 wt.-% to 1 wt.-% titanium.

The connection element according to the invention can also contain at least 73 wt.-% to 89.5 wt.-% iron, 10.5 wt.-% to 20 wt.-% chromium, 0 wt.-% to 0.5 wt.-% carbon, 0 wt.-% to 2.5 wt.-% nickel, 0 wt.-% to 1 wt.-% manganese, 0 wt.-% to 1 wt.-% molybdenum, 0 wt.-% to 1 wt.-% niobium, and/or 0 wt.-% to 1 wt.-% titanium.

The connection element according to the invention contains preferably at least 75 wt.-% to 84 wt.-% iron, 16 wt.-% to 18.5 wt.-% chromium, 0 wt.-% to 0.1 wt.-% carbon, 0 wt.-% to 1 wt.-% manganese, and/or 0 wt.-% to 1 wt.-% titanium.

The connection element according to the invention can also contain at least 78.5 wt.-% to 84 wt.-% iron, 16 wt.-% to 18.5 wt.-% chromium, 0 wt.-% to 0.1 wt.-% carbon, 0 wt.-% to 1 wt.-% manganese, 0 wt.-% to 1 wt.-% niobium, and/or 0 wt.-% to 1 wt.-% titanium.

The connection element according to the invention contains preferably a chromium-containing steel with a proportion of chromium greater than or equal to 10.5 wt.-% and a coefficient of thermal expansion of $9 \times 10^{-6}/°$ C. to $13 \times 10^{-6}/°$ C. Further alloy components such as molybdenum, manganese, or niobium result in improved corrosion stability or altered mechanical properties, such as tensile strength or cold formability.

The advantage of connection elements made of chromium-containing steel compared to connection elements according to the prior art made of titanium resides in the better solderability. It results from the higher thermal conductivity of 25 W/mK to 30 W/mK compared to the thermal conductivity of titanium of 22 W/mK. The higher thermal conductivity results in a more uniform heating of the connection element during the soldering process, by means of which the pointwise formation of particularly hot sites ("hot spots") is avoided. These sites are starting points for subsequent damage of the pane. Improved adhesion of the connection element to the pane results. Chromium-containing steel is, moreover, well weldable. With it, better connecting of the connection element to the onboard electronics via an electrically conductive material, e.g., copper, by welding, is possible. Due to the better cold formability, the connection element can also be better crimped with the electrically conductive material. Chromium-containing steel is, moreover, more available.

The electrically conductive structure according to the invention has, preferably, a layer thickness of 5 μm to 40 μm, particularly preferably from 5 μm to 20 μm, very particularly preferably, from 8 μm to 15 μm and, most particularly, from 10 μm to 12 μm. The electrically conductive structure according to the invention contains, preferably, silver, particularly preferably, silver particles and glass frits.

The layer thickness of the solder according to the invention is preferably $<3.0 \times 10^{-4}$ m.

The solder material is preferably leadfree, i.e., contains no lead. This is particularly advantageous with regard to the environmental impact of the pane with an electrical connection element according to the invention. Leadfree solder materials typically have less ductility than lead-containing solder materials, such that mechanical stresses between a connection element and a pane can be less well compensated. However, it has been demonstrated that critical mechanical stresses can clearly be reduced by means of the connection element according to the invention. The solder material according to the invention contains, preferably, tin and bismuth, indium, zinc, copper, silver, or compositions thereof. The proportion of tin in the solder composition according to the invention is from 3 wt.-% to 99.5 wt.-%, preferably from 10 wt.-% to 95.5 wt.-%, particularly preferably from 15 wt.-% to 60 wt.-%. The proportion of bismuth, indium, zinc, copper, silver, or compositions thereof in the solder composition according to the invention is from 0.5 wt.-% to 97 wt.-%, preferably 10 wt.-% to 67 wt.-%, whereby the proportion of bismuth, indium, zinc, copper, or silver can be 0 wt.-%. The solder composition according to the invention can contain nickel, germanium, aluminum, or phosphorus at a proportion of 0 wt.-% to 5 wt.-%. The solder composition according to the invention contains, very particularly preferably, Bi40Sn57Ag3, Sn40Bi57Ag3, Bi59Sn40Ag1, Bi57Sn42Ag1, In97Ag3, Sn95.5Ag3.8Cu0.7, Bi67In33, Bi33In50Sn17, Sn77.2In20Ag2.8, Sn95Ag4Cu1, Sn99Cu1, Sn96.5Ag3.5, or mixtures thereof.

The connection element according to the invention is coated, preferably, with nickel, tin, copper, and/or silver. The connection element according to the invention is particularly preferably provided with an adhesion-promoting layer, preferably made of nickel and/or copper, and, additionally, with a solderable layer, preferably made of silver. The connection element according to the invention is coated, very particularly preferably, with 0.1 μm to 0.3 μm nickel and/or 3 μm to 20 μm silver. The connection element can be plated with nickel, tin, copper, and/or silver. Nickel and silver improve the current-carrying capacity and corrosion stability of the connection element and the wetting with the solder material.

The iron-nickel alloy, the iron-nickel-cobalt alloy, or the iron-chromium alloy can also be welded, crimped, or glued as a compensation plate onto a connection element made, for example, of steel, aluminum, titanium, copper. As a bimetal, favorable expansion behavior of the connection element relative to the glass expansion can be obtained. The compensation plate is preferably hat-shaped.

The electrical connection element contains, on the surface facing the solder material, a coating that contains copper, zinc, tin, silver, gold, or alloys or layers thereof, preferably silver. This prevents a spreading of the solder material out beyond the coating and limits the outflow width.

The shape of the electrical connection element can form solder depots in the intermediate space of the connection element and the electrically conductive structure. The solder depots and wetting properties of the solder on the connection element prevent the outflow of the solder material from the intermediate space. The solder depots can be rectangular, rounded, or polygonal in design.

The distribution of the soldering heat and, thus, the distribution of the solder material during the soldering process can be defined by the shape of the connection element. Solder material flows to the warmest point. For example, the connection element can have a single or double hat shape in order to distribute the heat advantageously in the connection element during the soldering process.

The introduction of the energy during the electrical connecting of an electrical connection and an electrically conductive structure occurs preferably by means of punches, thermodes, piston soldering, preferably laser soldering, hot air soldering, induction soldering, resistance soldering, and/or with ultrasound.

The object of the invention is further accomplished through a method for production of a pane with at least one connection element, wherein a) solder material is applied on the contact surface or on the contact surfaces of the connection element as a platelet with a fixed layer thickness, volume, and shape, b) an electrically conductive structure is applied to a region of a substrate, c) the connection element with the solder material is arranged on the electrically conductive structure, d) energy is introduced at the soldering points, and e) the connection element is soldered to the electrically conductive structure.

The solder material is preferably applied in advance to the connection elements, preferably as a platelet with a fixed layer thickness, volume, shape, and arrangement on the connection element.

The connection element can, for example, be welded or crimped to a sheet, a braided wire, a mesh made, for example, of copper and connected to the onboard electrical system.

The connection element is preferably used in heated panes or in panes with antennas in buildings, in particular, in automobiles, railroads, aircraft, or watercraft. the connection element serves to connect the conducting structures of the pane to electrical systems that are arranged outside the pane. The electrical systems are amplifiers, control units, or voltage sources.

Figure 1A:
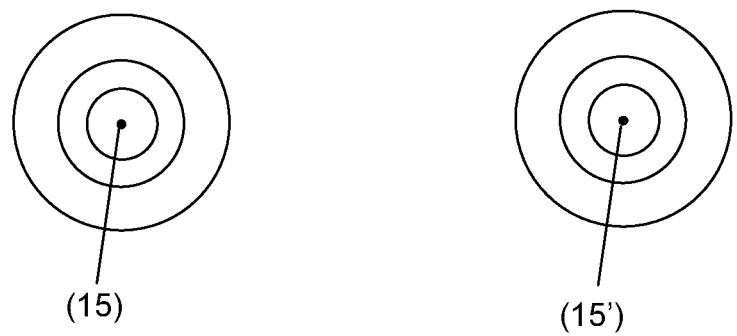
Figure 2A:
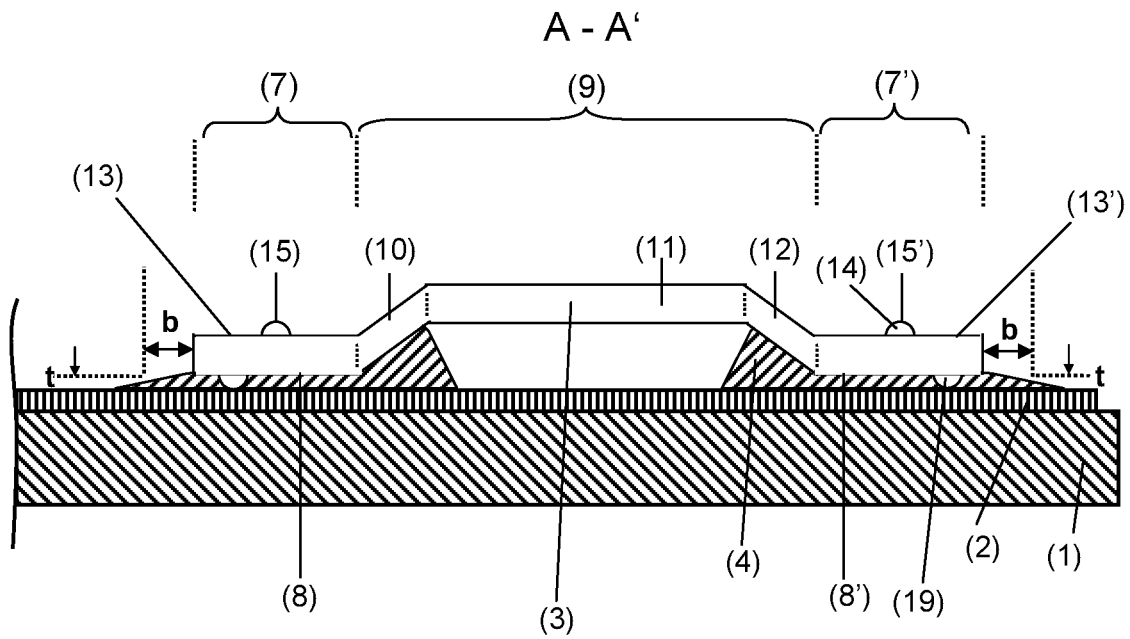
Figure 2B:
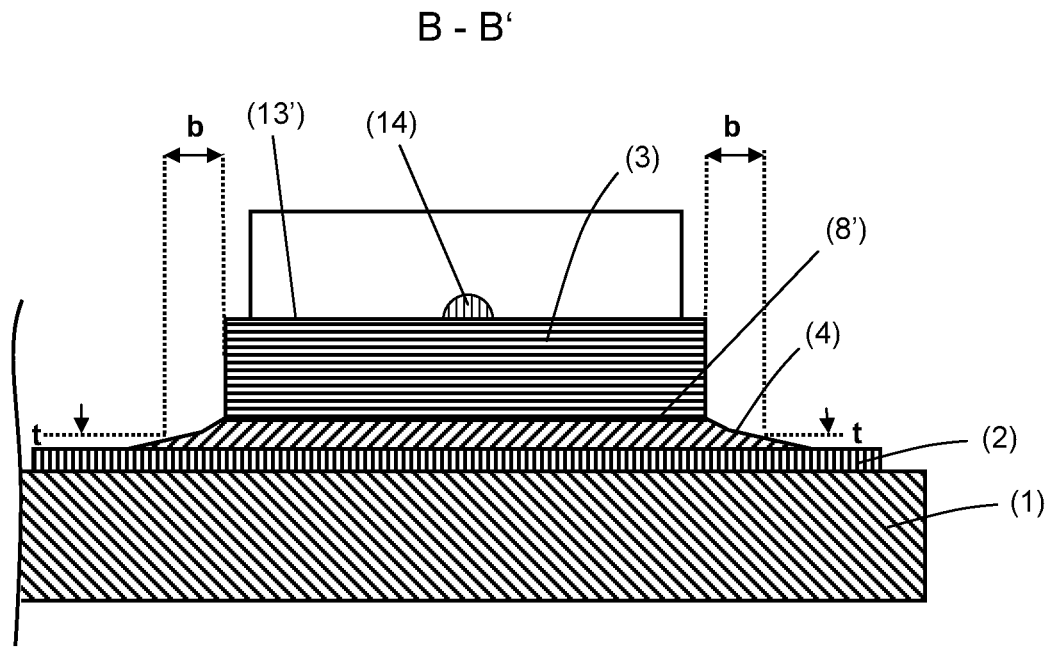
Figure 2C:
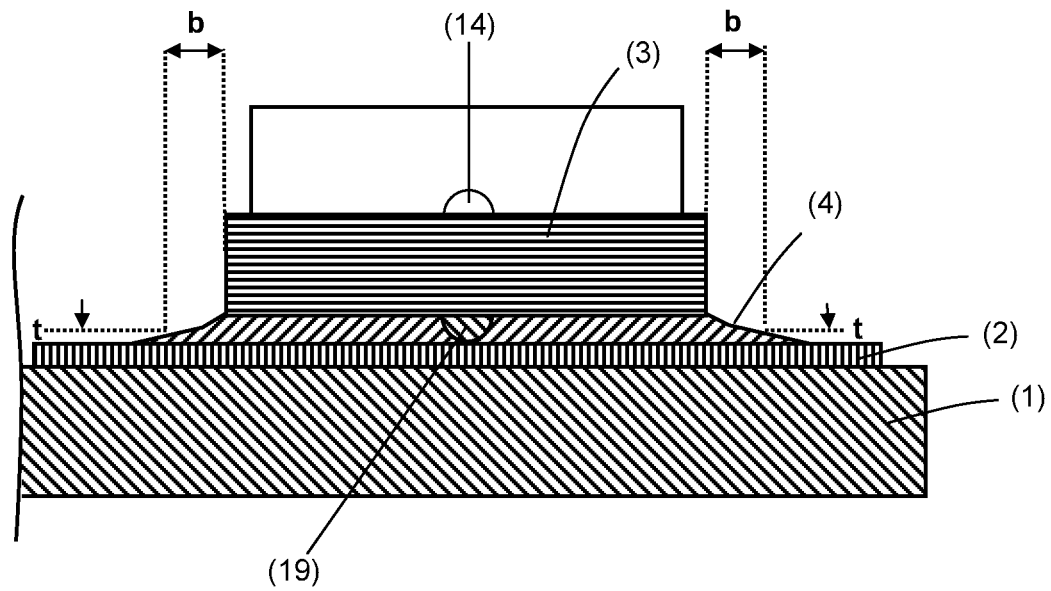
Figure 3:
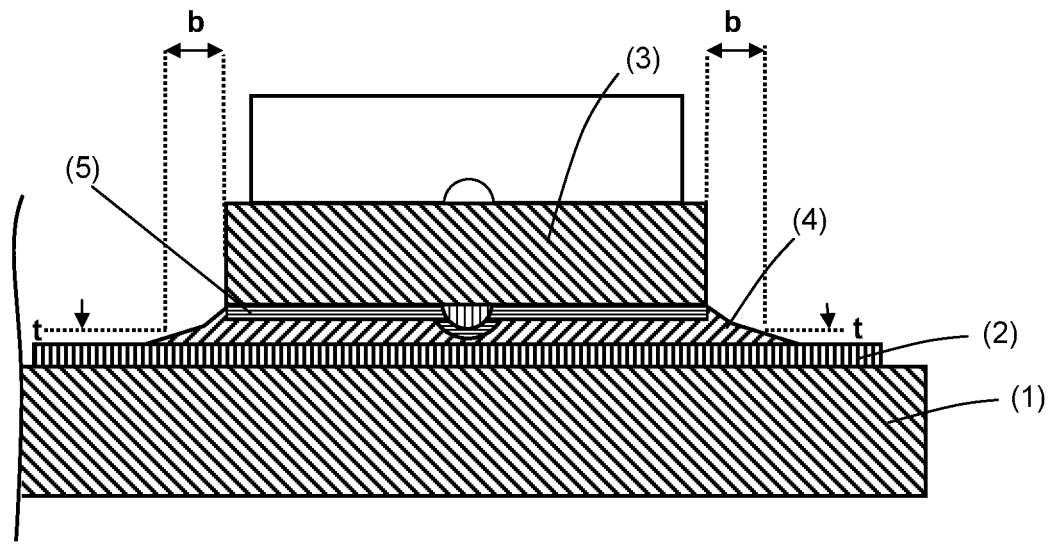
Figure 4:
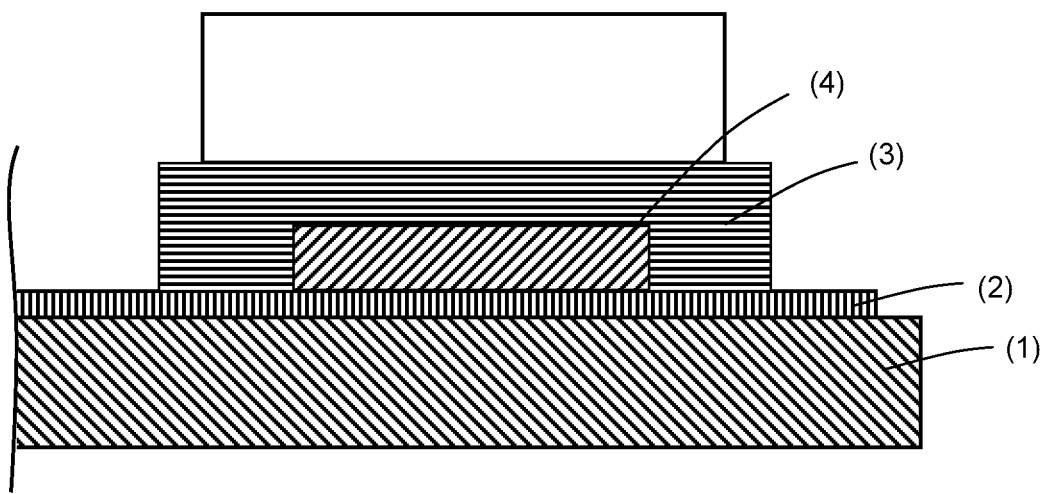
Figure 5:
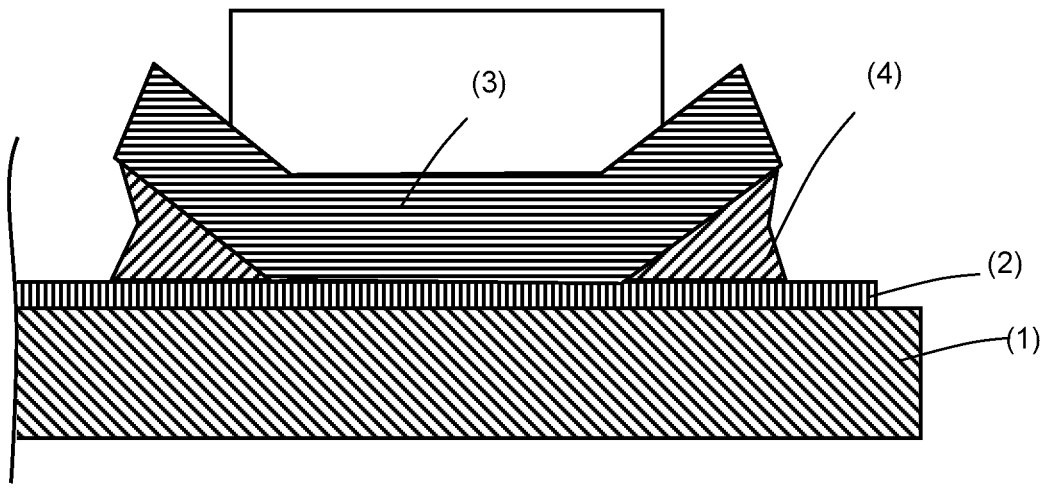
Figure 6:
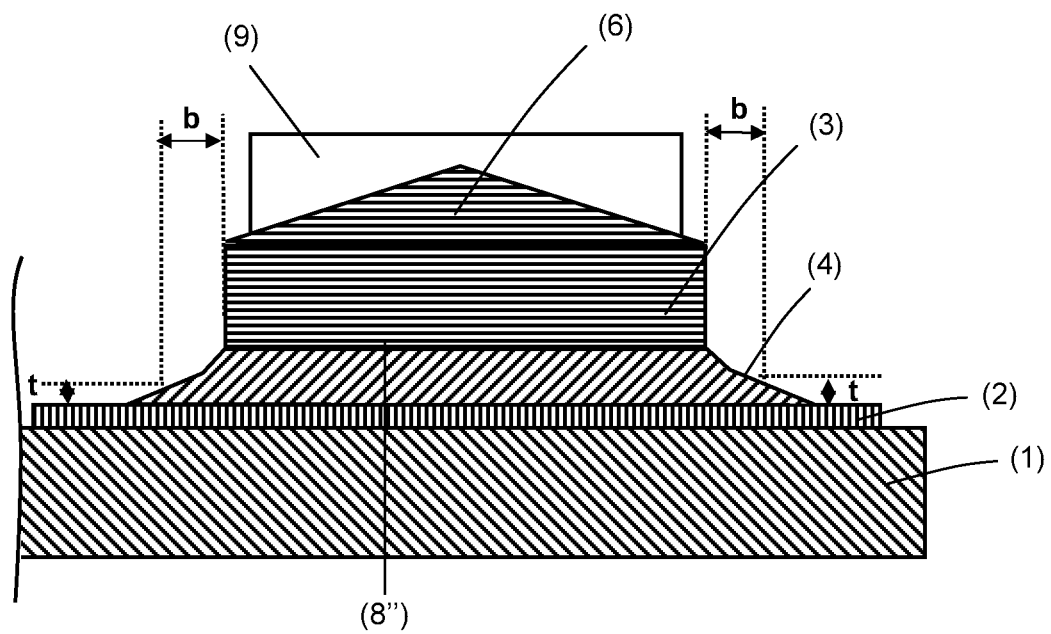
Figure 7:
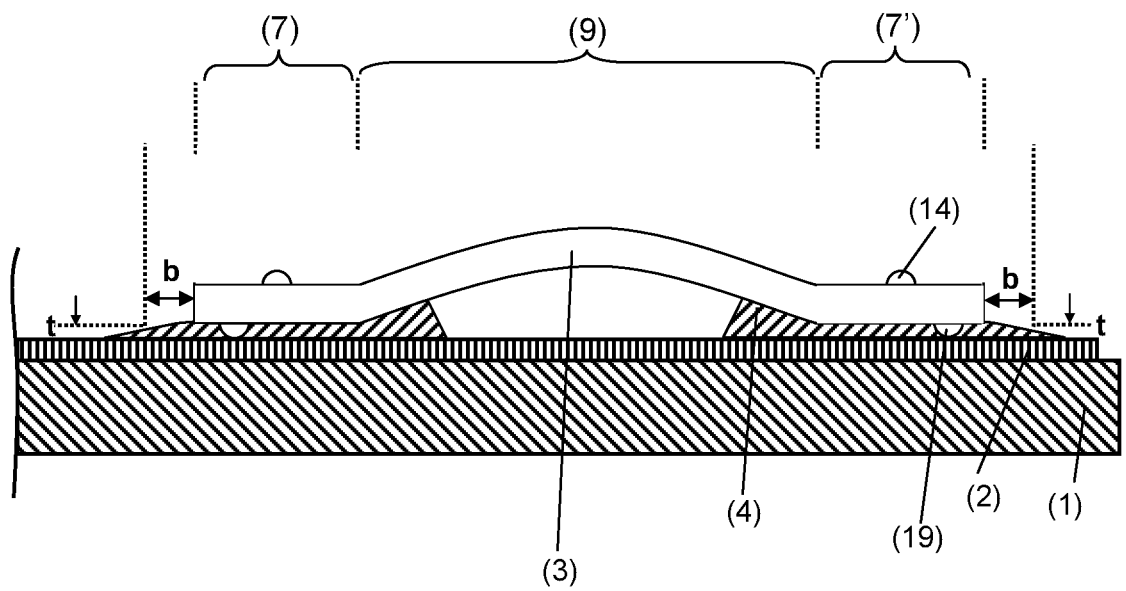
Figure 8:
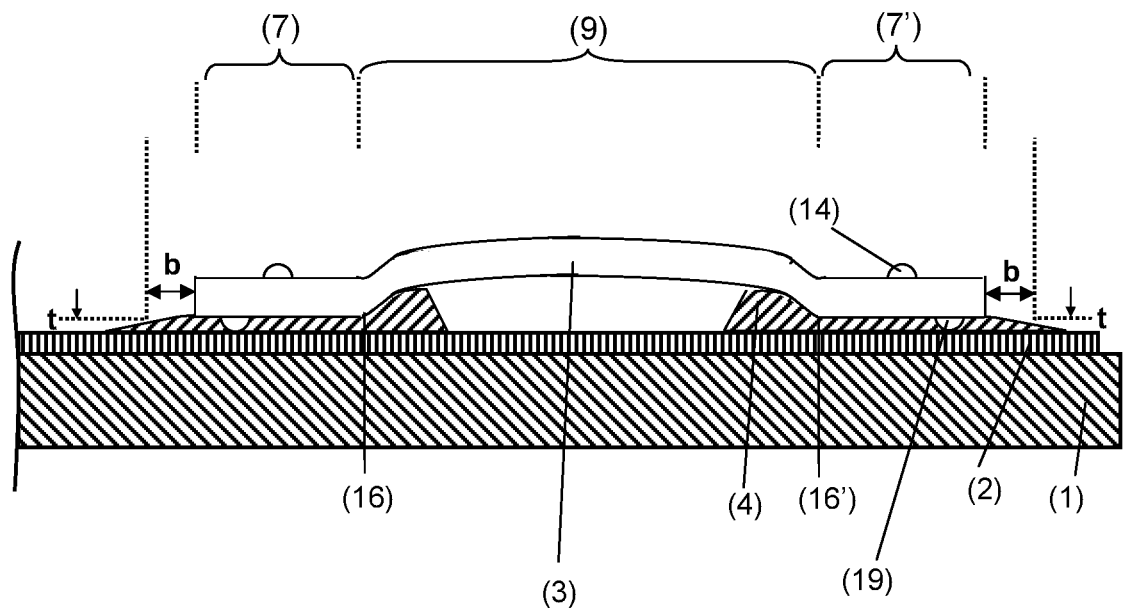
Figure 8A:
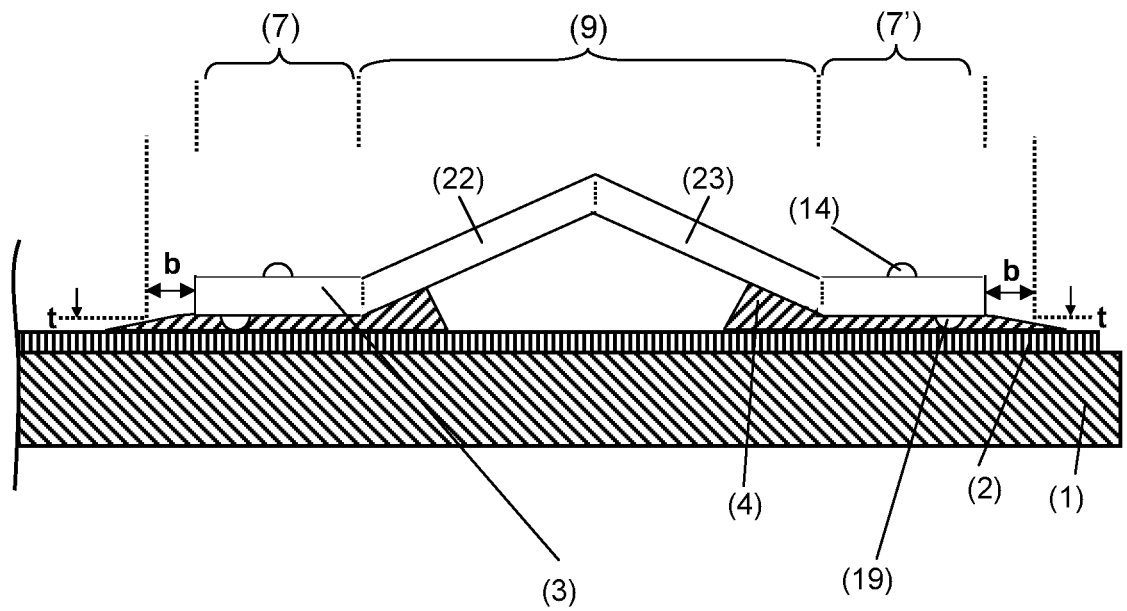
Figure 9:
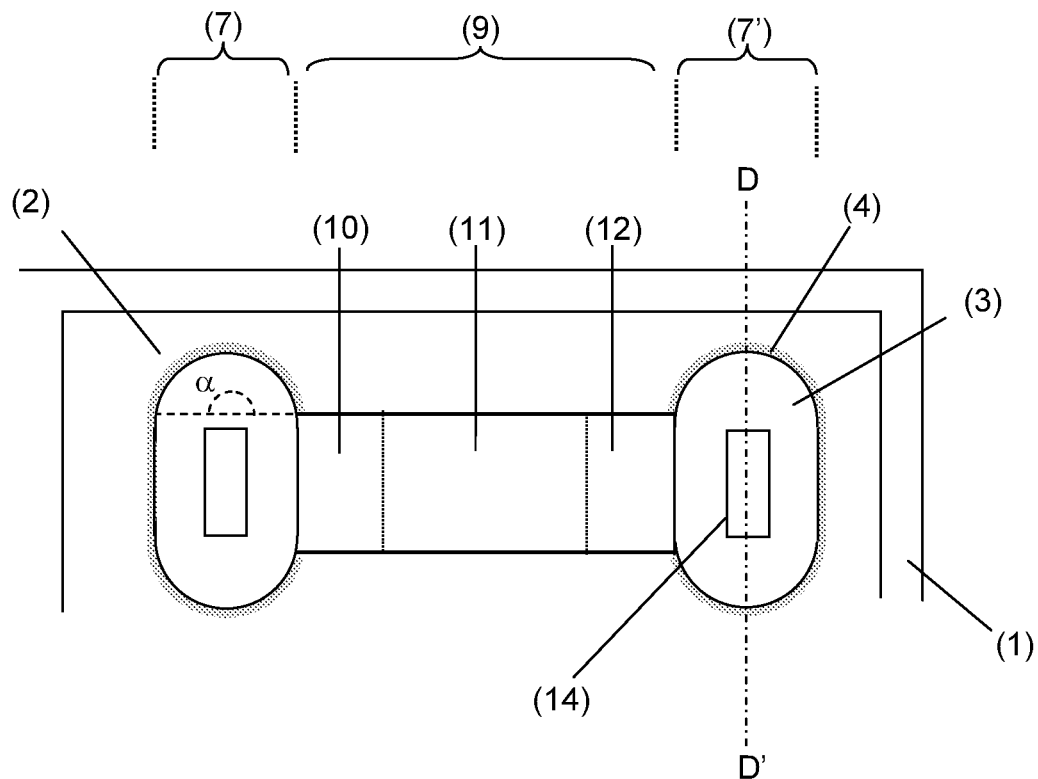
Figure 9A:
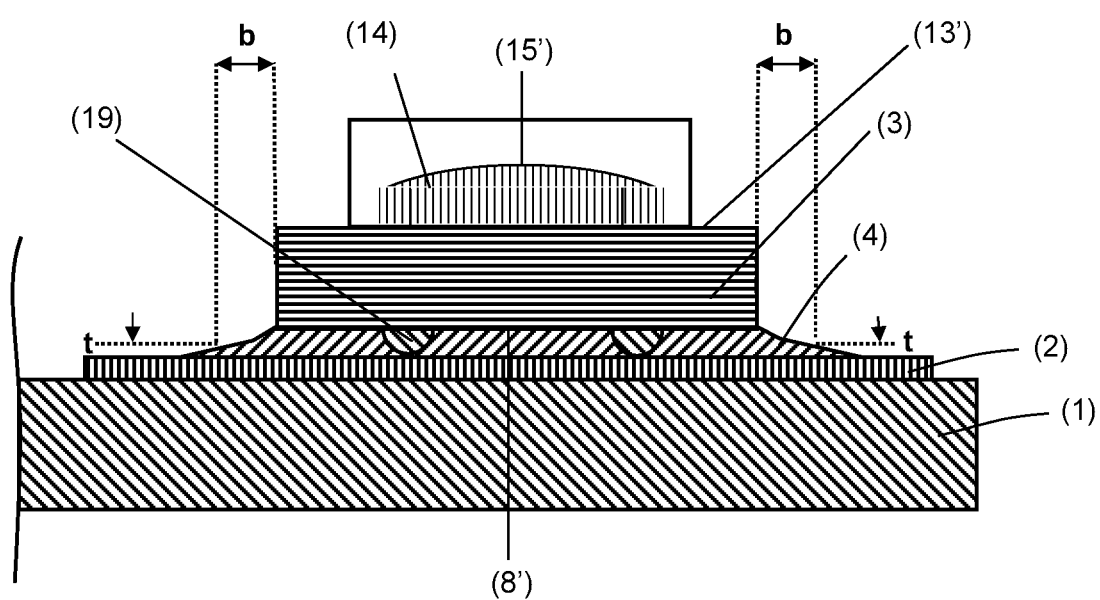
Figure 10:
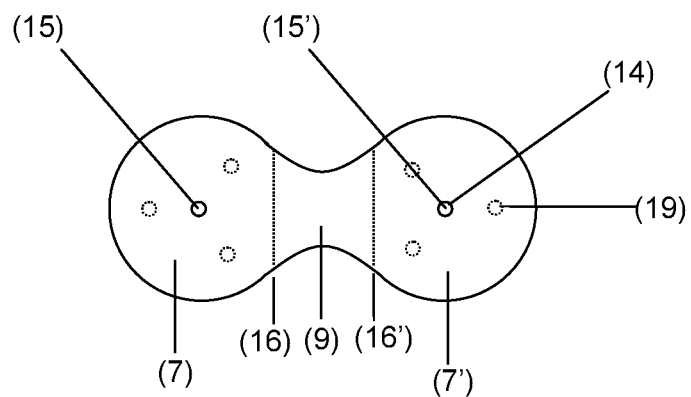
Figure 11:
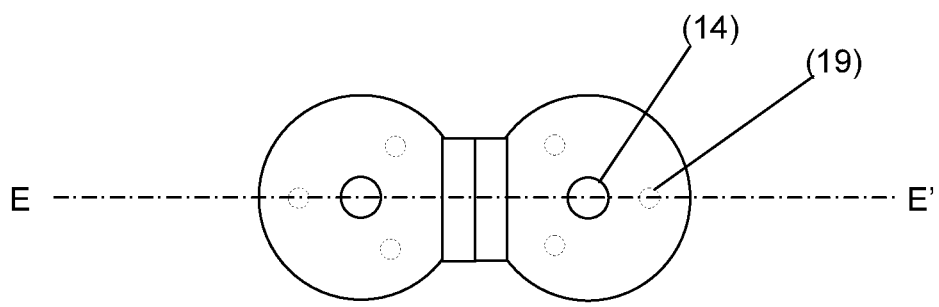
Figure 11A:
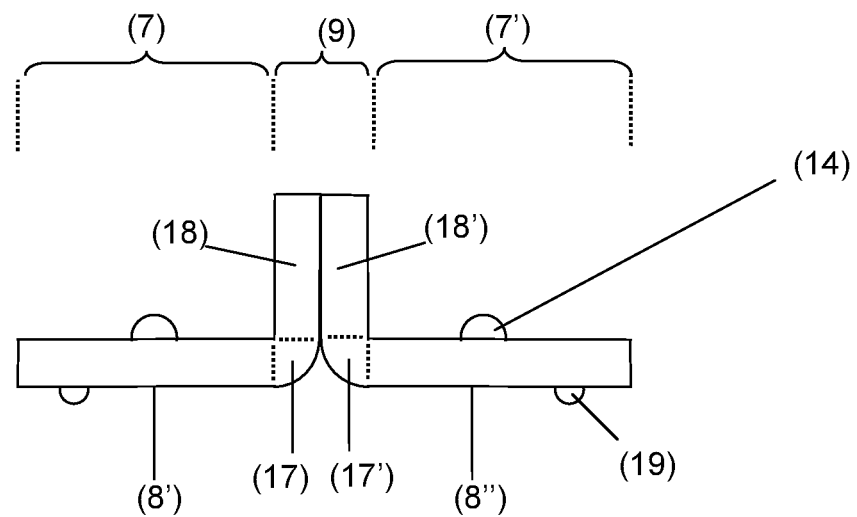
Figure 12:
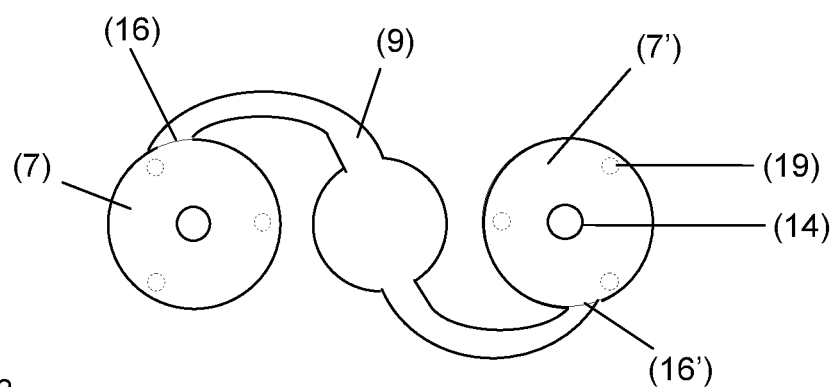
Figure 13:
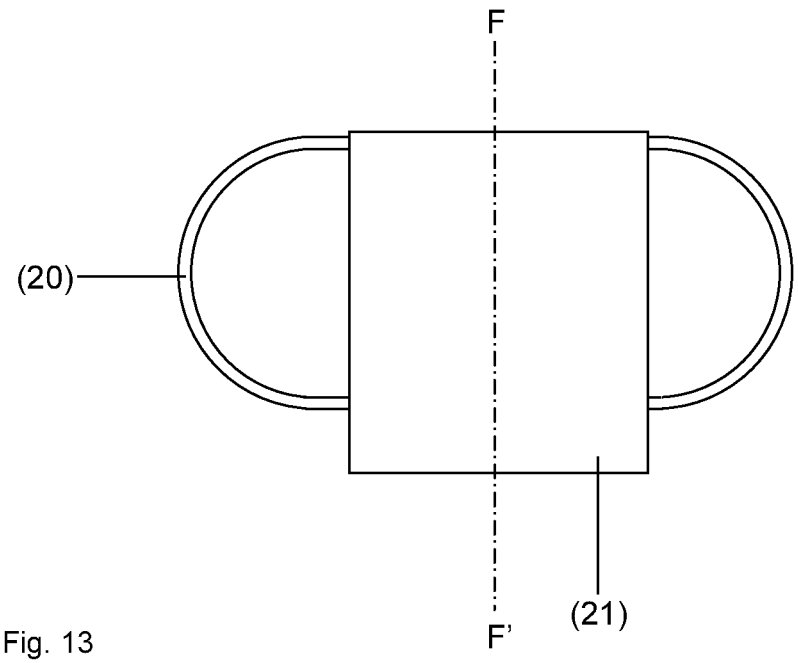
Figure 13A:
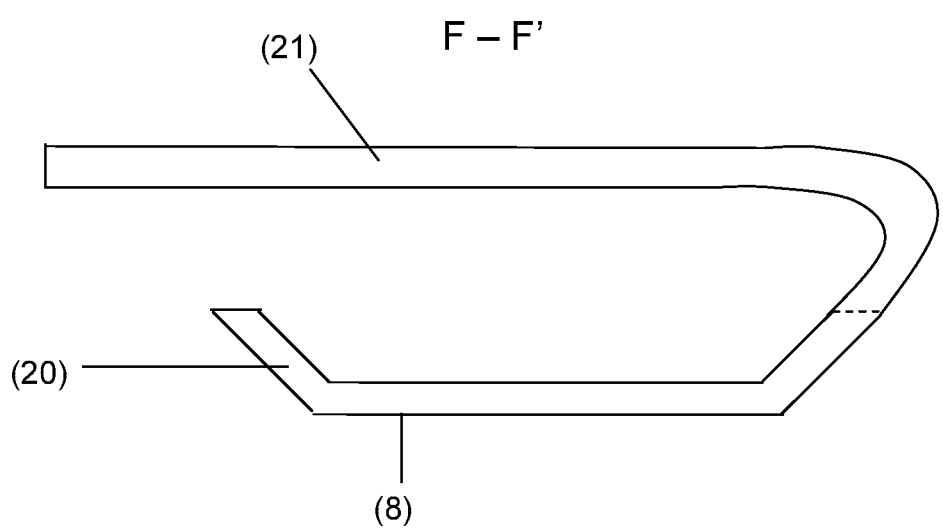
Figure 14:
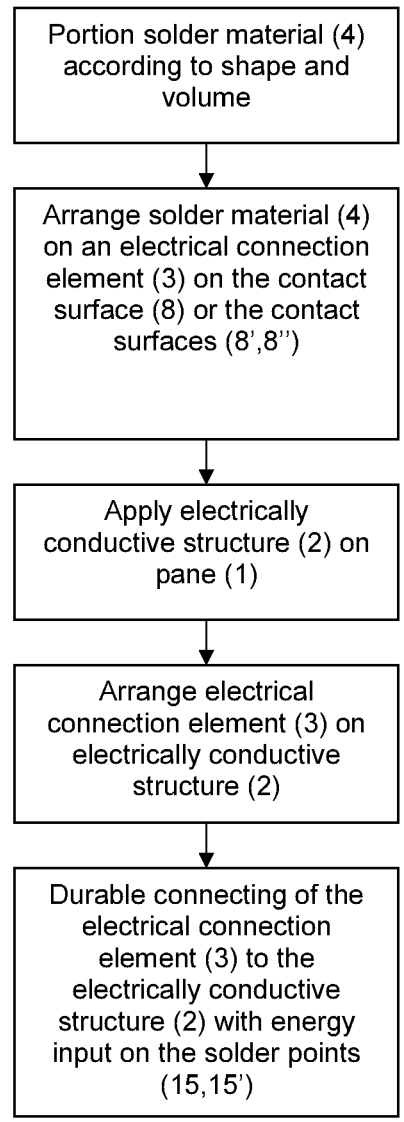

The invention is explained in detail with reference to drawings and exemplary embodiments. The drawings are a schematic representation and not true to scale. The drawings do not restrict the invention in any way. They depict:

FIG. 1a plan view of a first embodiment of the pane according to the invention,

FIG. 1a a schematic representation of the heat distribution during the soldering process, FIG. 2a a cross-section A-A' through the pane of FIG. 1, FIG. 2b a cross-section B-B' through the pane of FIG. 1, FIG. 2c a cross-section C-C' through the pane of FIG. 1, FIG. 3 a cross-section C-C' through an alternative pane according to the invention, FIG. 4 a cross-section B-B' through another alternative pane according to the invention, FIG. 5 a cross-section B-B' through another alternative pane according to the invention, FIG. 6 a cross-section B-B' through another alternative pane according to the invention, FIG. 7 a cross-section A-A' through another alternative pane according to the invention, FIG. 8 a cross-section A-A' through another alternative pane according to the invention, FIG. 8a a cross-section A-A' through another alternative pane according to the invention, FIG. 9 a plan view of an alternative embodiment of the pane according to the invention, FIG. 9a a cross-section D-D' through the pane of FIG. 9, FIG. 10 a plan view of an alternative embodiment of the connection element, FIG. 11 a plan view of another alternative embodiment of the connection element, FIG. 11a a cross-section E-E' through the connection element of FIG. 11, FIG. 12 a plan view of another alternative embodiment of the connection element, FIG. 13 a plan view of another alternative embodiment of the connection element, FIG. 13a a cross-section F-F' through the connection element of FIG. 13, FIG. 14 a detailed flow chart of the method according to the invention.

FIG. 1, FIG. 2a, FIG. 2b, and FIG. 2c show, in each case, a detail of a heatable pane 1 according to the invention in the region of the electrical connection element 3. The pane 1 is a 3-mm-thick thermally prestressed single-pane safety glass made of soda lime glass. The pane 1 has a width of 150 cm and a height of 80 cm. An electrically conductive structure 2 in the form of a heating conductor structure 2 is printed on the pane 1. The electrically conductive structure 2 contains silver particles and glass frits. In the edge region of the pane 1, the electrically conductive structure 2 is widened to a width of 10 mm and forms a contact surface for the electrical connection element 3. In the edge region of the pane 1, there is also a covering serigraph (not shown). The connection element 3 consists of two foot regions 7 and 7' that are connected to each other via the bridge 9. On the surfaces of the foot regions 7 and 7' facing the substrate, two contact surfaces 8' and 8" are arranged. In the region of the contact surfaces 8' and 8", the solder material 4 effects a durable electrical and mechanical connection between the connection element 3 and the electrically conductive structure 2. The solder material 4 contains 57 wt.-% bismuth, 40 wt.-% tin, and 3 wt.-% silver. The solder material 4 is arranged through a predefined volume and shape completely between the electrical connection element 3 and the electrically conductive structure 2. The solder material 4 has a thickness of 250 µm. The electrical connection element 3 is made from steel of the material number 1.4509 in accordance with EN 10 088-2 (ThyssenKrupp Nirosta® 4509) with a coefficient of thermal expansion of $10.0 \times 10^{-6}/°$ C. Each of the contact surfaces 8' and 8" has the shape of a circular segment with a radius of 3 mm and a central angle α of 276°. The bridge 9 consists of three flat segments 10, 11, and 12. The surface of each of the two segments 10 and 12 facing the substrate encloses an angle of 40° with the surface of the substrate 1. The segment 11 is arranged parallel to the surface of the substrate 1. The electrical connection element 3 has a length of 24 mm. The two foot regions 7 and 7' have a width of 6 mm; the bridge 9 has a width of 4 mm.

On each of the surfaces 13 and 13' of the foot regions 7 and 7' facing away from the substrate, a contact bump 14 is arranged. The contact bumps 14 are shaped as hemispheres and have a height of $2.5 \times 10^{-4}$ m and a width of $5 \times 10^{-4}$ m. The centers of the contact bumps 14 are arranged vertical to the surface of the substrate above the circle centers of the contact surfaces 8' and 8". The soldering points 15 and 15' are arranged at the points on the convex surface of the contact bumps 14 that have the greatest vertical distance from the surface of the substrate.

Three spacers 19 are arranged on each of the contact surfaces 8' and 8". The spacers 19 are shaped as hemispheres and have a height of $2.5 \times 10^{-4}$ m and a width of $5 \times 10^{-4}$ m.

Steel of the material number 1.4509 in accordance with EN 10 088-2 has good cold forming properties and good welding properties with all methods except gas welding. The steel is used for construction of sound suppressor systems and exhaust gas detoxification systems and is particularly suited for that due to its scaling resistance to more than 950° C. and corrosion resistance against the stresses occurring in the exhaust gas system.

FIG. 1a depicts schematically a simplified representation of the heat distribution around the soldering points 15 and 15' during the soldering process. The circular lines there are isotherms. The shape of the contact surfaces 8' and 8" of the connection elements 3 of FIG. 1 is adapted to the heat distribution. Thus, the solder material 4 in the region of the contact surfaces 8' and 8" is uniformly and completely fuzed.

FIG. 3 depicts, in continuation of the exemplary embodiment of FIGS. 1 and 2c, an alternative embodiment of the connection element 3 according to the invention. The electrical connection element 3 is provided on the surface facing the solder material 4 with a silver-containing coating 5. This prevents spreading of the solder material out beyond the coating 5 and limits the outflow width b. In another embodiment, an adhesion-promoting layer made, for example, of nickel and/or copper, can be located between the connection element 3 and the silver-containing layer 5. The outflow width b of the solder material 4 is less than 1 mm. No critical mechanical stresses are observed in the pane 1 due to the arrangement of the solder material 4. The connection of the pane 1 to the electrical connection element 3 via the electrically conductive structure 2 is durably stable.

FIG. 4 depicts, in continuation of the exemplary embodiment of FIGS. 1 and 2c, another alternative embodiment of the connection element 3 according to the invention. The electrical connection element 3 contains, on the surface facing the solder material 4, a recess with a depth of 250 µm that forms a solder depot for the solder material 4. It is possible to completely prevent outflow of the solder material 4 from the intermediate space. The thermal stresses in the pane 1 are noncritical and a durable electrical and mechanical connection is provided between the connection element 3 and the pane 1 via the electrically conductive structure 2.

FIG. 5 depicts, in continuation of the exemplary embodiment of FIGS. 1 and 2c, another alternative embodiment of the connection element 3 according to the invention. The foot regions 7 and 7' of the electrical connection element 3 are bent upward on the edge regions. The height of the upward bend of the edge region of the glass pane 1 is a maximum of 400 µm. This forms a space for the solder material 4. The predefined solder material 4 forms a concave meniscus between the electrical connection element 3 and the electrically conductive structure 2. It is possible to completely prevent outflow of solder material 4 from the intermediate space. The outflow width b, at roughly 0, is less than zero, largely because of the meniscus formed. The thermal stresses in the pane 1 are noncritical, and a durable electrical and mechanical connection is provided between the connection element 3 and the pane 1 via the electrically conductive structure 2.

FIG. 6 depicts another alternative embodiment of the connection element 3 according to the invention with contact surfaces 8' and 8" in the shape of circular segments and bridge 9 shaped flat in sections. The connection element 3 contains an iron-containing alloy with a coefficient of thermal expansion of $8 \times 10^{-6}/°$ C. The material thickness is 2 mm. In the region of the contact surfaces 8' and 8" of the connection element 3, hat-shaped compensation members 6 are applied with chromium-containing steel of the material number 1.4509 in accordance with EN 10 088-2 (ThyssenKrupp Nirosta® 4509). The maximum layer thickness of the hat-shaped compensation members 6 is 4 mm. By means of the compensation members, it is possible to adapt the coefficients of thermal expansion of the connection element 3 to the requirements of the pane 1 and of the solder material 4. The hat-shaped compensation members 6 result in improved heat flow during the production of the solder connection 4. The heating occurs primarily in the center of the contact surfaces 8' and 8". It is possible to further reduce the outflow width b of the solder material 4. Because of the low outflow width b of <1 mm and the adapted coefficient of expansion, it is possible to further reduce the thermal stresses in the pane 1. The thermal stresses in the pane 1 are noncritical, and a durable electrical and mechanical connection is provided between the connection element 3 and the pane 1 via the electrically conductive structure 2.

FIG. 7 depicts, in continuation of the exemplary embodiment of FIGS. 1 and 2a, an alternative embodiment of the connection element 3 according to the invention. The bridge 9 is curved and has the profile of a circular arc with a radius of curvature of 12 mm. The thermal stresses in the pane 1 are noncritical and a durable electrical and mechanical connection is provided between the connection element 3 and the pane 1 via the electrically conductive structure 2.

FIG. 8 depicts, in continuation of the exemplary embodiment of FIGS. 1 and 2a, another alternative embodiment of the connection element 3 according to the invention. The bridge 9 is curved and changes its direction of curvature twice. Adjacent the foot regions 7 and 7', the direction of curvature turns away from the substrate 1. Thus, there are no edges on the connections 16 and 16' between the contact surfaces 8' and 8" and the bottom of the bridge 9. The bottom of the connection element 3 has a continuous progression. The thermal stresses in the pane 1 are noncritical and a durable electrical and mechanical connection is provided between the connection element 3 and the pane 1 via the electrically conductive structure 2.

FIG. 8a depicts, in continuation of the exemplary embodiment of FIGS. 1 and 2a, another alternative embodiment of the connection element 3 according to the invention. The bridge 9 consists of two flat segments 22 and 23. The surface of each of the two segments 22 and 23 facing the substrate encloses an angle of 20° with the surface of the substrate 1. Together, the surfaces of the two segments 22 and 23 facing the substrate enclose an angle of 140°. The thermal stresses in the pane 1 are noncritical and a durable electrical and mechanical connection is provided between the connection element 3 and the pane 1 via the electrically conductive structure 2.

FIG. 9 and FIG. 9a depict, in each case, a detail of another embodiment of the pane 1 according to the invention in the region of the electrical connection element 3. The connection element 3 contains steel of the material number 1.4509 in accordance with EN 10 088-2 (ThyssenKrupp Nirosta® 4509). The foot regions 7 and 7' are connected to each other via the bridge 9. The bridge 9 consists of three flatly shaped segments 10, 11, and 12. Each of the contact surfaces 8' and 8" is shaped as a rectangle with semicircles arranged on opposite sides. The connection element 3 has a length of 24 mm. The bridge 9 has a width of 4 mm. The contact surfaces 8' and 8" are 4 mm long and 8 mm wide.

A contact bump 14 is arranged on each of the surfaces 13 and 13' of the foot regions 7 and 7' turned away from the substrate 1. Each contact bump 14 is shaped as a rectangular solid with a length of 3 mm and a width of 1 mm, with the surfaces turned away from the substrate 1 curved convexly. The height of the contact bumps is 0.6 mm. The soldering points 15 and 15' are arranged at the points on the convex surface of the contact bumps 14 that have the greatest vertical distance from the surface of the substrate. Two spacers 19 that are shaped as hemispheres with a radius of $2.5 \times 10^{-4}$ m are arranged on each of the contact surfaces 8' and 8". No critical mechanical stresses were observed in the pane 1 due to the arrangement of the solder material 4. The connection of the pane 1 to the electrical connection element 3 via the electrically conductive structure 2 is durably stable.

FIG. 10 depicts a plan view of an alternative embodiment of the connection element 3 according to the invention. The foot regions 7 and 7' are connected to each other via the bridge 9. The contact surfaces 8 and 8' are formed as circular segments with a radius of 2.5 mm and a central angle α of 280°. The bridge 9 is curved. The width of the bridge becomes smaller starting from the connections 16 and 16' to the contact surfaces 8 and 8' in the direction of the center of the bridge. The minimum width of the bridge is 3 mm. No critical mechanical stresses were observed in the pane 1 due to the arrangement of the solder material 4. The connection of the pane 1 to the electrical connection element 3 via the electrically conductive structure 2 is durably stable.

In an alternative embodiment of the invention, the connection element 3 with the contour of FIG. 10 is not configured in the form of a bridge. Here, the connection element 3 is connected to the electrically conductive structure over its entire surface via a contact surface 8.

FIG. 11 and FIG. 11a depict, in each case, a detail of another alternative embodiment of the connection element 3 according to the invention. The two foot regions 7 and 7' are connected to each other via the bridge 9. Each contact surface 8' and 8" is shaped as a circular segment with a radius of 2.5 mm and a central angle α von 286°. The bridge 9 consists of two subelements. The subelements have, in each case, a curved subregion 17 and 17' and a flat subregion 18 and 18'. The bridge 9 is connected to the foot region 7 via the subregion 17 and to the foot region 7' via the subregion 17'. The directions of curvature of the subregions 17 and 17' turn away from the substrate 1. The flat subregions 18 and 18' are arranged perpendicular to the surface of the substrate and are in direct contact with each other. The contact bumps 14 are shaped as hemispheres with a radius of $5 \times 10^{-4}$ m. The spacers 19 are shaped as hemispheres with a radius of $2.5 \times 10^{-4}$ m. The connection element 3 has a length of 10 mm. The foot regions 7 and 7' have a width of 5 mm; the bridge 9 has a width of 3 mm. The height of the bridge 9 from the surface of the substrate 1 is 3 mm. The height of the bridge 9 can preferably be between 1 mm and 5 mm. No critical mechanical stresses were observed in the pane 1 due to the arrangement of the solder material 4. The connection of the pane 1 to the electrical connection element 3 via the electrically conductive structure 2 is durably stable.

FIG. 12 depicts a plan view of another alternative embodiment of the connection element 3 according to the invention. The two foot regions 7 and 7' are connected to each other via a curved bridge 9. Each contact surface 8' and 8" is shaped as a circle with a radius of 2.5 mm. The two connections 16 and 16' between the foot regions 7 and 7' and the bridge 9 are arranged completely on different sides of the direct connecting line between the circle centers of the contact surfaces 8' and 8". The projection of the bridge into the plane of the substrate surface is curved. In this case, the direction of curvature changes in the center of the bridge. Laterally, in the center of the bridge 9, are arranged two convexities opposite each other in the shape of circular segments with radii of 2 mm. The radii of the convexities can preferably be between 1 mm and 3 mm. The convexities can, for example, also have a rectangular shape with a preferred length and width from 1 mm to 6 mm. On the region of the bridge 9 that is delimited by the edges of the convexities, an electrically conductive material for connection to the onboard electrical system can, for example, be applied, by welding or crimping, for example. No critical mechanical stresses are observed in the pane 1 due to the arrangement of the solder material 4. The connection of the pane 1 to the electrical connection element 3 via the electrically conductive structure 2 is durably stable.

FIG. 13 and FIG. 13a depict, in each case, a detail of another alternative embodiment of the connection element 3 according to the invention. The connection element 3 is connected over its entire surface to the electrically conductive structure 2 via a contact surface 8. The contact surface 8 is shaped as a rectangle with semicircles arranged on opposite sides. The contact surface has a length of 14 mm and a width of 5 mm. The connection element 3 is bent upward all around in the edge region 20. The height of the edge region 20 from the glass pane 1 is 2.5 mm. The height of the edge region 20 can, in alternative embodiments of the invention, preferably be between 1 mm and 3 mm. An extension element 21 is arranged on the bent-up edge on one of the two straight sides of the connection element 3. The extension element 21 consists of a curved subregion and a flat subregion. The extension element 21 is connected to the edge region 20 of the connection element 3 via the curved subregion and the direction of curvature is toward the opposite side of the connection element 3. The extension element 21 has, in the plan view, a length of 11 mm and a width of 6 mm. The extension element 21 can preferably have a length between 5 mm and 20 mm, particularly preferably between 7 mm and 15 mm, and a width of 2 mm to 10 mm, particularly preferably from 4 mm to 8 mm. An electrically conductive material for connection to the onboard electrical system can, for example, be applied on the extension element 21, for example, by wielding, crimping, or in the form of a plug connector. No critical mechanical stresses are observed in the pane 1 due to the arrangement of the solder material 4. The connection of the pane 1 to the electrical connection element 3 via the electrically conductive structure 2 is durably stable.

FIG. 14 depicts in detail a method according to the invention for production of a pane 1 with an electrical connection element 3. An example of the method according to the invention for production of a pane with an electrical connection element 3 is presented there. As the first step, it is necessary to portion the solder material 4 according to shape and volume. The portioned solder material 4 is arranged on the contact surface 8 or the contact surfaces 8' and 8" of the electrical connection element 3. The electrical connection element 3 is arranged with the solder material 4 on the electrically conductive structure 2. A durable connection of the electrical connection element 3 to the electrically conductive structure 2 and, thus, to the pane 1 takes place through the input of energy on the soldering points 15 and 15'.

EXAMPLE

Test specimens were produced with the pane 1 (thickness 3 mm, width 150 cm, and height 80 cm), the electrically conductive structure 2 in the form of a heating conductor structure, the electrical connection element 3 according to FIG. 1, the silver layer 5 on the contact surfaces 8' and 8" of the connection element 3, and the solder material 4. The material thickness of the connection element 3 was 0.8 mm. The connection element 3 contained steel of the material number 1.4509 in accordance with EN 10 088-2 (Thyssen-Krupp Nirosta® 4509). Three spacers 19 were arranged on each of the contact surfaces 8' and 8". Each soldering point 15 and 15' was arranged on a contact bump 14. The solder material 4 was applied in advance as a platelet with fixed layer thickness, volume, and shape on the contact surfaces 8' and 8"of the connection element 3. The connection element 3 was applied with the solder material 4 applied on the electrically conductive structure 2. The connection element 3 was soldered onto the electrically conductive structure 2 at a temperature of 200° C. and a processing time of 2 seconds. Outflow of the solder material 4 from the intermediate space between the electrical connection element 3 and the electrically conductive structure 2, which exceeded a layer thickness t of 50 µm, was observed only to a maximum outflow width of b=0.4 mm. The dimensions and compositions of the electrical connection element 3, the silver layer 5 on the contact surfaces 8' and 8" of the connection element 3, and the solder material 4 are found in Table 1. No critical mechanical stresses were observed in the pane 1 due to the arrangement of the solder material 4, predefined by the connection element 3 and the electrically conductive structure 2. The connection of the pane 1 to the electrical connection element 3 via the electrically conductive structure 2 was durably stable.

With all specimens, it was possible to observe, with a temperature difference from +80° C. to −30° C., that no glass substrate 1 broke or showed damage. It was possible to demonstrate that, shortly after soldering, these panes 1 with the soldered connection element 3 were stable against a sudden temperature drop.

In addition, test specimens were executed with a second composition of the electrical connection element 3. Here, the connection element 3 contained an iron-nickel-cobalt alloy. The dimensions and compositions of the electrical connection element 3, the silver layer 5 on the contact surfaces 8' and 8" of the connection element 3, and the solder material 4 are found in Table 2. With the outflow of the solder material 4 from the intermediate space between the electrical connection element 3 and the electrically conductive structure 2, which exceeded a layer thickness t of 50 µm, an average outflow width b=0.4 mm was obtained. Here as well, it was possible to observe that, with a temperature difference from +80° C. to −30° C., no glass substrate 1 broke or showed damage. It was possible to demonstrate that, shortly after soldering, these panes 1 with the soldered connection element 3 were stable against a sudden temperature drop.

In addition, test specimens were executed with a third composition of the electrical connection element 3. Here, the connection element 3 contained an iron-nickel alloy. The dimensions and compositions of the electrical connection element 3, the silver layer 5 on the contact surfaces 8' and 8" of the connection element 3, and the solder material 4 are found in Table 3. With the outflow of the solder material 4 from the intermediate space between the electrical connection element 3 and the electrically conductive structure 2, which exceeded a layer thickness t of 50 µm, an average outflow width b=0.4 mm was obtained. Here as well, it was possible to observe that, with a temperature difference from +80° C. to −30° C., no glass substrate 1 broke or showed damage. It was possible to demonstrate that, shortly after soldering, these panes 1 with the soldered connection element 3 were stable against a sudden temperature drop.

TABLE 1

| Components | Material | Example |
|---|---|---|
| Connection element 3 | Steel of material no. 1.4509 in accordance with EN 10 088-2 with the composition: | |
| | Iron (wt.-%) | 78.87 |
| | Carbon (wt.-%) | 0.03 |
| | Chromium (wt.-%) | 18.5 |
| | Titanium (wt.-%) | 0.6 |
| | Niobium (wt.-%) | 1 |
| | Manganese (wt.-%) | 1 |
| | CTE (coefficient of thermal expansion) ($10^{-6}$/° C. for 0° C.-100° C.) | 10 |
| | Difference between CTE of the connection element and substrate ($10^{-6}$/° C. for 0° C.-100° C.) | 1.7 |
| | Thickness of the connection element (m) | $8.0 \times 10^{-4}$ |

TABLE 1-continued

| Components | Material | Example |
|---|---|---|
| Wetting layer 5 | Silver (wt.-%) | 100 |
|  | Thickness of the layer (m) | $7.0 \times 10^{-6}$ |
| Solder material 4 | Tin (wt.-%) | 40 |
|  | Bismuth (wt.-%) | 57 |
|  | Silver (wt.-%) | 3 |
|  | Thickness of the solder layer in (m) | $250 \times 10^{-6}$ |
|  | The thickness of the wetting layer and the solder layer (m) | $257 \times 10^{-6}$ |
| Glass substrate 1 (Soda lime glass) | CTE ($10^{-6}/°$ C. for 0° C.-320° C.) | 8.3 |

TABLE 2

| Components | Material | Example |
|---|---|---|
| Connection element 3 | Iron (wt.-%) | 54 |
|  | Nickel (wt.-%) | 29 |
|  | Cobalt (wt.-%) | 17 |
|  | CTE (coefficient of thermal expansion) ($10^{-6}/°$ C. for 0° C.-100° C.) | 5.1 |
|  | Difference between CTE of the connection element and substrate ($10^{-6}/°$ C. for 0° C.-100° C.) | 3.2 |
|  | Thickness of the connection element (m) | $8.0 \times 10^{-4}$ |
| Wetting layer 5 | Silver (wt.-%) | 100 |
|  | Thickness of the layer (m) | $7.0 \times 10^{-6}$ |
| Solder material 4 | Tin (wt.-%) | 40 |
|  | Bismuth (wt.-%) | 57 |
|  | Silver (wt.-%) | 3 |
|  | Thickness of the solder layer in (m) | $250 \times 10^{-6}$ |
|  | The thickness of the wetting layer and the solder layer (m) | $257 \times 10^{-6}$ |
| Glass substrate 1 (Soda lime glass) | CTE ($10^{-6}/°$ C. for 0° C.-320° C.) | 8.3 |

TABLE 3

| Components | Material | Example |
|---|---|---|
| Connection element 3 | Iron (wt.-%) | 65 |
|  | Nickel (wt.-%) | 35 |
|  | CTE (coefficient of thermal expansion) ($10^{-6}/°$ C. for 0° C.-100° C.) | 1.7 |
|  | Difference between CTE of the connection element and substrate ($10^{-6}/°$ C. for 0° C.-100° C.) | 6.6 |
|  | Thickness of the connection element (m) | $8.0 \times 10^{-4}$ |
| Wetting layer 5 | Silver (wt.-%) | 100 |
|  | Thickness of the layer (m) | $7.0 \times 10^{-6}$ |
| Solder material 4 | Tin (wt.-%) | 40 |
|  | Bismuth (wt.-%) | 57 |
|  | Silver (wt.-%) | 3 |
|  | Thickness of the solder layer in (m) | $250 \times 10^{-6}$ |
|  | The thickness of the wetting layer and the solder layer (m) | $257 \times 10^{-6}$ |
| Glass substrate 1 (Soda lime glass) | CTE ($10^{-6}/°$ C. for 0° C.-320° C.) | 8.3 |

COMPARATIVE EXAMPLE

The comparative example was carried out the same as the example. The difference resided in the shape of the connection element. This was, according to the prior art, connected to the electrically conductive structure via a rectangular contact surface. The shape of the contact surface was not adapted to the profile of the heat distribution. No spacers were arranged on the contact surface. The soldering points 15 and 15' were not arranged on contact bumps. The dimensions and components of the electrical connection element 3, of the metal layer on the contact surface of the connection element 3, and of the solder material 4 are found in Table 4. The connection element 3 was soldered to the electrically conductive structure 2 in accordance with conventional methods by means of the solder material 4. With the outflow of the solder material 4 from the intermediate space between the electrical connection element 3 and the electrically conductive structure 2, which exceeded a layer thickness t of 50 μm, an average outflow width b=2 mm to 3 mm was obtained.

With a sudden temperature difference from +80° C. to −30° C., it was observed that the glass substrates 1 had major damage shortly after soldering.

TABLE 4

| Components | Material | Comparative example |
|---|---|---|
| Connection element 3 | Steel of material no. 1.4509 in accordance with EN 10 088-2 with the composition: |  |
|  | Iron (wt.-%) | 78.87 |
|  | Carbon (wt.-%) | 0.03 |
|  | Chromium (wt.-%) | 18.5 |
|  | Titanium (wt.-%) | 0.6 |
|  | Niobium (wt.-%) | 1 |
|  | Manganese (wt.-%) | 1 |
|  | CTE (coefficient of thermal expansion) ($10^{-6}/°$ C. for 0° C.-100° C.) | 10 |
|  | Difference between CTE of the connection element and the substrate ($10^{-6}/°$ C. for 0° C.-100° C.) | 1.7 |
|  | Thickness of the connection element (m) | $8.0 \times 10^{-4}$ |
| Wetting layer 5 | Silver (wt.-%) | 100 |
|  | Thickness of the layer (m) | $7.0 \times 10^{-6}$ |
| Solder material 4 | Tin (wt.-%) | 40 |
|  | Bismuth (wt.-%) | 57 |
|  | Silver (wt.-%) | 3 |
|  | Thickness of the solder layer in (m) | $250 \times 10^{-6}$ |
|  | The thickness of the wetting layer and the solder layer (m) | $257 \times 10^{-6}$ |
| Glass substrate 1 (Soda lime glass) | CTE ($10^{-6}/°$ C. for 0° C.-320° C.) | 8.3 |

It was demonstrated that panes according to the invention with glass substrates 1 and electrical connection elements 3 according to the invention had better stability against sudden temperature differences.

This result was unexpected and surprising for the person skilled in the art.

LIST OF REFERENCE CHARACTERS (1) Pane
(2) Electrically conductive structure
(3) Electrical connection element
(4) Solder material
(5) Wetting layer
(6) Compensation member
(7) Foot region of the electrical connection element 3
(7') Foot region of the electrical connection element 3
(8) Contact surface of the connection element 3
(8') Contact surface of the connection element 3
(8") Contact surface of the connection element 3
(9) Bridge between the foot regions 7 and 7'
(10) Segment of the bridge 9
(11) Segment of the bridge 9
(12) Segment of the bridge 9

(13) Surface of the foot region 7 turned away from the substrate 1
(13') Surface of the foot region 7' turned away from the substrate 1
(14) Contact bump
(15) Soldering point
(15') Soldering point
(16) Connection of contact surface 8 and the bottom of the bridge 9
(16') Connection the contact surface 8' and the bottom of the bridge 9
(17) Subregion of the bridge 9
(17') Subregion of the bridge 9
(18) Subregion of the bridge 9
(18') Subregion of the bridge 9
(19) Spacer
(20) Edge region of the connection element 3
(21) Extension element
(22) Segment of the bridge 9
(23) Segment of the bridge 9 α Central angle of a circular segment of a contact surface 8'
b Maximum outflow width of the solder material
t Limiting thickness of the solder material
A-A' Section line
B-B' Section line
C-C' Section line
D-D' Section line
E-E' Section line

The invention claimed is:

1. A pane, comprising:
   a substrate, the substrate having a first coefficient of thermal expansion from $8\times10^{-6}/°$ C. to $9\times10^{-6}/°$ C.,
   at least one electrical connection element,
   an electrically conductive structure on a region of the substrate,
   a layer of a solder material on a region of the electrically conductive structure,
   wherein each of the at least one electrical connection element
      has a second coefficient of thermal expansion from $10\times10^{-6}/°$ C. to $13\times10^{-6}/°$ C., wherein a difference between the first coefficient of thermal expansion of the substrate and the second coefficient of thermal expansion of the connection element is less than $5\times10^{-6}/°$ C.,
      contains at least 50 wt. % to 89.5 wt. % iron, 16 wt. % to 20 wt. % chromium, and one or more elements selected from the group of carbon, nickel, manganese, molybdenum, and titanium,
      has at least two soldering points on the solder material, which form two contact surfaces, separated from each other, between the at least one electrical connection element and the electrically conductive structure, wherein the two contact surfaces are connected to each other via a surface of a bridge facing the substrate, and
   wherein a shape of each of the two contact surfaces has at least one segment of an oval, an ellipse, or a circle with a central angle α of at least 90°.

2. The pane according to claim 1, wherein the two contact surfaces are formed in a shape of a rectangle with two semicircles arranged on opposite sides.

3. The pane according to claim 1, wherein each of the two contact surfaces is formed in a shape of a circle or a circular segment with a central angle α of at least 180°.

4. The pane according to claim 1, wherein the substrate contains glass, polymers, or mixtures of glass and polymers.

5. The pane according to claim 1, wherein spacers are arranged on the two contact surfaces.

6. The pane according to claim 1, wherein each of the two soldering points is arranged on a contact bump.

7. The pane according to claim 1, wherein the solder material contains tin and i) bismuth, ii) indium, iii) zinc, iv) copper, v) silver, or compositions of i)-v).

8. The pane according to claim 7, wherein a proportion of tin in the solder material is 3 wt. % to 99.5 wt. % and a proportion of i) bismuth, ii) indium, iii) zinc, iv) copper, v) silver, or compositions of i)-v) is 0.5 wt. % to 97 wt. %.

9. The pane according to claim 1, wherein the at least one electrical connection element is coated with nickel, tin, copper, or silver, or a mixture thereof.

10. A method for production of a pane with at least one electrical connection element according to claim 1, comprising:
    a) applying a solder material on at least one contact surface of the at least one electrical connection element as a platelet with a fixed layer thickness, volume, and shape,
    b) applying an electrically conductive structure to a region of a substrate, the substrate having a first coefficient of thermal expansion from $8\times10^{-6}/°$ C. to $9\times10^{-6}/°$ C.,
    c) arranging the at least one electrical connection element with the solder material on the electrically conductive structure, wherein the at least one electrical connection element has a second coefficient of thermal expansion from $10\times10^{-6}/°$ C. to $13\times10^{-6}/°$ C., wherein the at least one electrical connection element contains at least 50 wt.-% to 89.5 wt.-% iron, 16 wt.-% to 20 wt.-% chromium, and one or more elements selected from the group of carbon, nickel, manganese, molybdenum, and titanium, and wherein the difference between the first coefficient of thermal expansion of the substrate and the second coefficient of thermal expansion of the connection element is less than $5\times10^{-6}/°$ C.,
    d) introducing energy to at least two soldering points, and
    e) soldering the at least one electrical connection element to the electrically conductive structure, thereby producing the pane, the pane including the substrate,
    the electrically conductive structure on the region of the substrate,
    a layer of a solder material on a region of the electrically conductive structure, and
    at least two soldering points of the at least one electrical connection element on the solder material, wherein
    the at least two soldering points form two contact surfaces between the at least one electrical connection element and the electrically conductive structure, each of the at least two soldering points being arranged on a contact bump, and
    a shape of each of the two contact surfaces has at least one segment of an
    oval, an ellipse, or a circle with a central angle α of at least 90°.

11. A method, comprising:
    using the pane with at least one electrical connection element according to claim 1, for vehicles with electrically conductive structures, preferably with heating conductors and/or antenna conductors.

12. The pane according to claim 3, wherein the central angle α is at least 220°.

13. The pane according to claim 4, wherein the glass is flat glass, float glass, quartz glass, borosilicate glass or soda lime glass.

14. The pane according to claim 4, wherein the polymers are polyethylene, polypropylene, polycarbonate, or polymethyl methacrylate.

15. The pane according to claim 9, wherein the at least one electrical connection element is coated with 0.1 μm to 0.3 μm nickel or 3 μm to 20 μm silver, or both 0.1 μm to 0.3 μm nickel and 3 μm to 20 μm silver.

* * * * *

UNITED STATES PATENT AND TRADEMARK OFFICE
CERTIFICATE OF CORRECTION

| | | |
|---|---|---|
| PATENT NO. | : 11,456,546 B2 | Page 1 of 1 |
| APPLICATION NO. | : 16/428236 | |
| DATED | : September 27, 2022 | |
| INVENTOR(S) | : Christoph Degen et al. | |

It is certified that error appears in the above-identified patent and that said Letters Patent is hereby corrected as shown below:

On the Title Page

Item [30], insert:
--May 10, 2011 (EP) ………………….. 11165506--

Signed and Sealed this
First Day of November, 2022

Katherine Kelly Vidal
*Director of the United States Patent and Trademark Office*